(12) United States Patent
Saito et al.

(10) Patent No.: US 8,896,076 B2
(45) Date of Patent: Nov. 25, 2014

(54) PHOTOELECTRIC CONVERSION ELEMENT, PHOTOELECTRIC CONVERSION SYSTEM, AND METHOD FOR PRODUCTION OF PHOTOELECTRIC CONVERSION ELEMENT

(71) Applicant: Kabushiki Kaisha Toshiba, Minato-ku (JP)

(72) Inventors: Shinji Saito, Kanagawa (JP); Rei Hashimoto, Tokyo (JP); Mizunori Ezaki, Kanagawa (JP); Shinya Nunoue, Chiba (JP); Hironori Asai, Kanagawa (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 13/953,029

(22) Filed: Jul. 29, 2013

(65) Prior Publication Data
US 2014/0048818 A1    Feb. 20, 2014

(30) Foreign Application Priority Data

Aug. 20, 2012  (JP) .................. 2012-181377
Jul. 8, 2013    (JP) .................. 2013-143022

(51) Int. Cl.
| H01L 31/115 | (2006.01) |
| H01L 33/30  | (2010.01) |
| H01L 33/00  | (2010.01) |
| H01L 31/00  | (2006.01) |

(52) U.S. Cl.
CPC ............ *H01L 33/30* (2013.01); *H01L 33/0075* (2013.01); *Y02E 10/544* (2013.01); *H01L 31/00* (2013.01)

USPC .................. 257/431; 257/458; 257/E31.127; 257/E29.336

(58) Field of Classification Search
USPC .......... 257/431, 458, 459, E29.336, E31.127, 257/E31.047, E31.061
See application file for complete search history.

(56) References Cited

U.S. PATENT DOCUMENTS

| 2007/0169804 A1 | 7/2007 | Nakata |
| 2011/0318866 A1 | 12/2011 | Pan et al. |
| 2012/0073639 A1* | 3/2012 | Park et al. ..................... 136/255 |

FOREIGN PATENT DOCUMENTS

| JP | 3580169 | 7/2004 |
| JP | 4180636 | 9/2008 |
| JP | 2010-267934 | 11/2010 |
| JP | 2011-198975 | 10/2011 |

* cited by examiner

*Primary Examiner* — Hoai V Pham
(74) *Attorney, Agent, or Firm* — Oblon, Spivak, McClelland, Maier & Neustadt, L.L.P.

(57) ABSTRACT

A photoelectric conversion element of an embodiment is a photoelectric conversion element which performs photoelectric conversion by receiving illumination light having n light emission peaks having a peak energy $A_p$ (eV) (where $1 \leq p \leq n$ and $2 \leq n$) of $1.59 \leq A_p \leq 3.26$ and a full width at half maximum $F_p$ (eV) (where $1 \leq p \leq n$ and $2 \leq n$), wherein the photoelectric conversion element includes m photoelectric conversion layers having a band gap energy $B_q$ (eV) (where $1 \leq q \leq m$ and $2 \leq m \leq n$), and the m photoelectric conversion layers each satisfy the relationship of $A_p - F_p < B_q \leq A_p$ with respect to any one of the n light emission peaks.

8 Claims, 12 Drawing Sheets

PHOTOELECTRIC CONVERSION ELEMENT, PHOTOELECTRIC CONVERSION SYSTEM, AND METHOD FOR PRODUCTION OF PHOTOELECTRIC CONVERSION ELEMENT

CROSS-REFERENCE TO RELATED APPLICATION

This application is based upon and claims the benefit of priority from Japanese Patent Application No. 2012-181377, filed on Aug. 20, 2012, and Japanese Patent Application No. 2013-143022, filed on Jul. 8, 2013, the entire contents of which are incorporated herein by reference.

FIELD

Embodiments described herein relate generally to a photoelectric conversion element, a photoelectric conversion system, and a method for manufacturing a photoelectric conversion element.

BACKGROUND

Photoelectric conversion elements include a variety of types depending on the structure and application thereof, such as a LED (Light Emitting Diode), a LD (Laser Diode), a PD (Photo Diode) and a solar cell. The development of photovoltaic power generation for generating electric power using a solar cell is actively promoted as renewable energy is increasingly required.

The solar cell is essentially structured so as to efficiently generate electric power by receiving sunlight. On the other hand, portable information device have come into wide use as small and multi-functional information devices as represented by smart phones.

For example, the required amount of electric power increases as the portable information device becomes multi/high-functionalized. However, the capacity of a built-in battery, such as a lithium battery, which stores electric power is limited. Therefore, such a problem arises that the frequency of charging the portable information device is increased.

Thus, if electric power can be generated by a high-efficiency solar cell to cover power consumption, the charge frequency can be reduced, so that a portable information device of high practicality can be achieved. Particularly, if a photoelectric conversion element that allows power generation of high efficiency with indoor illumination light having a light intensity lower than that of sunlight is achieved, the usefulness of the portable information device is enhanced.

DETAILED DESCRIPTION

Figure 1:
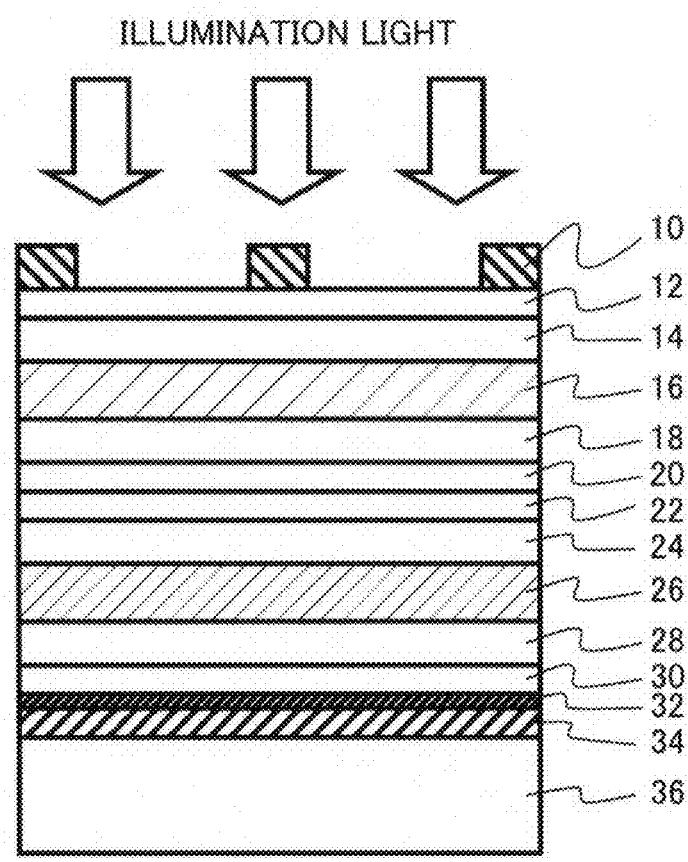
FIG. 1 is a sectional schematic view of a photoelectric conversion element of a first embodiment.

An photoelectric conversion element of an embodiment is a photoelectric conversion element which performs photoelectric conversion by receiving illumination light having n (n is a natural number) light emission peaks having a peak energy Ap (eV) (where $1 \leq p \leq n$ and $2 \leq n$) of $1.59 \leq Ap \leq 3.26$ and a full width at half maximum Fp (eV) (where $1 \leq p \leq n$ and $2 \leq n$), wherein the photoelectric conversion element includes m (m is a natural number) photoelectric conversion layers having a band gap energy Bq (eV) (where $1 \leq q \leq m$ and $2 \leq m \leq n$), and the m photoelectric conversion layers each satisfy the relationship of $Ap - Fp < Bq \leq Ap$ with respect to any one of the n light emission peaks.

In this specification, a peak energy Ap (eV) or a peak wavelength λp (nm) is used when identifying a light emission peak. The relationship between the former and the latter can be represented by $Ap = 1239.8/\lambda p$.

For example, a peak wavelength of 380 nm corresponds to a peak energy of 3.26 eV, and a peak wavelength of 780 nm corresponds to a peak energy of 1.59 eV.

Embodiments will be described below with reference to the drawings.

First Embodiment

A photoelectric conversion element of this embodiment performs photoelectric conversion by receiving illumination light having n (n is a natural number) light emission peaks having a peak energy Ap (eV) (where $1 \leq p \leq n$ and $2 \leq n$) of $1.59 \leq Ap \leq 3.26$ and a full width at half maximum Fp (eV) (where $1 \leq p \leq n$ and $2 \leq n$). The photoelectric conversion element includes m (m is a natural number) photoelectric conversion layers having a band gap energy Bq (eV) (where $1 \leq q \leq m$ and $2 \leq m \leq n$), and the m photoelectric conversion layers each satisfy the relationship of Ap−Fp<Bq≤Ap with respect to any one of the n light emission peaks.

By having the above-described structure, the photoelectric conversion element of this embodiment can achieve photoelectric conversion of high efficiency, i.e. power generation of high efficiency under illumination light having light emission peaks of a plurality of wavelengths within visible light, like illumination light emitted from, for example, an illuminator using a LED (Light Emitting Diode).

The photoelectric conversion element of this embodiment is structured to adapt to illumination light emitted from, for example, a white light illuminator including a blue LED, of which the wavelength $\lambda_1$ of the light emission peak is 450 nm ($A_1$=2.76 eV), and a yellow LED, of which the wavelength $\lambda_2$ of the light emission peak is 560 nm ($A_2$=2.21 eV). That is, the photoelectric conversion element is a photoelectric conversion element which performs photoelectric conversion by receiving illumination light having two light emission peaks: a first light emission peak having a peak energy $A_1$ of 2.76 eV and a second light emission peak having a peak energy $A_2$ of 2.21 eV.

Here, the first light emission peak has a full width at half maximum $F_1$ (eV), and the second light emission peak has a full width at half maximum $F_2$ (eV).

The photoelectric conversion element of this embodiment includes an n-side electrode formed on a side at which light is incident; a GaN-based n-type semiconductor layer formed below the n-side electrode; a first photoelectric conversion layer formed below the n-type semiconductor layer and having a composition denoted as $In_{x1}Ga_{y1}Al_{z1}N$ ($0<x1\leq1$, $0\leq y1<1$, $0\leq z1<1$ and $x1+y1+z1\leq1$); a second photoelectric conversion layer formed below the first photoelectric conversion layer and having a composition denoted as $In_{x2}Ga_{y2}Al_{z2}N$ ($0<x2\leq1$, $0\leq y2<1$, $0\leq z2<1$ and $x2+y2+z2\leq1$) wherein $x1<x2$; a GaN-based p-type semiconductor layer formed below the second photoelectric conversion layer; and a p-side electrode formed below the p-type semiconductor layer.

FIG. 1 is a sectional schematic view of the photoelectric conversion element of this embodiment. In the photoelectric conversion element of this embodiment, an n-side electrode 10 is formed on a side at which illumination light shown by white arrows in the figure is incident (upper side in FIG. 1). The n-side electrode 10 is a terminal that outputs a current obtained by photoelectric conversion. The n-side electrode 10 is, for example, a metal electrode, and can employ a laminated structure of, for example, Ti (titanium)/Pt (platinum)/Au (gold) from the lower layer.

A first n$^+$-type GaN (gallium nitride) layer 12 is formed below the n-side electrode 10. A first n$^-$-type GaN layer 14 is formed below the first n$^+$-type GaN layer 12. The first n$^+$-type GaN layer 12 and the first n$^-$-type GaN layer 14 contain, for example, Si (silicon) as an n-type impurity.

The n-type impurity concentration of the first n$^+$-type GaN layer 12 is, for example, $2\times10^{19}$ atoms/cm$^3$ to $1\times10^{20}$ atoms/cm$^3$. The n-type impurity concentration of the first n$^-$-type GaN layer 14 is, for example, $1\times10^{18}$ atoms/cm$^3$ to $1\times0^{19}$ atoms/cm$^3$.

A first photoelectric conversion layer 16 of, for example, $In_{0.15}Ga_{0.85}N$ (indium gallium nitride) is formed below the first n$^-$-type GaN layer 14. Here, the first photoelectric conversion layer 16 has a band gap energy $B_1$ (eV).

A first p$^-$-type GaN layer 18 is formed below the first photoelectric conversion layer 16. A first p$^+$-type GaN layer 20 is formed below the first p$^-$-type GaN layer 18. The first p$^-$-type GaN layer 18 and the first p$^+$-type GaN layer 20 contain, for example, Mg (magnesium) as a p-type impurity.

The p-type impurity concentration of the first p$^-$-type GaN layer 18 is, for example, $1\times10^{18}$ atoms/cm$^3$ to $1\times0^{19}$ atoms/cm$^3$. The p-type impurity concentration of the first p$^+$-type GaN layer 20 is, for example, $2\times10^{19}$ atoms/cm$^3$ to $1\times10^{20}$ atoms/cm$^3$.

A second n$^+$-type GaN layer 22 is formed below the first p$^+$-type GaN layer 20. A second n$^-$-type GaN layer 24 is formed below the second n$^+$-type GaN layer 22. The second n$^+$-type GaN layer 22 and the second n$^-$-type GaN layer 24 contain, for example, Si (silicon) as an n-type impurity.

The n-type impurity concentration of the second n$^+$-type GaN layer 22 is, for example, $2\times10^{19}$ atoms/cm$^3$ to $1\times10^{20}$ atoms/cm$^3$. The n-type impurity concentration of the second n$^-$-type GaN layer 24 is, for example, $1\times10^{18}$ atoms/cm$^3$ to $1\times0^{19}$ atoms/cm$^3$.

A second photoelectric conversion layer 26 of, for example, $In_{0.25}Ga_{0.75}N$ is formed below the second n$^-$-type GaN layer 24. Here, the second photoelectric conversion layer 26 has a band gap energy $B_2$ (eV).

A second p$^-$-type GaN layer 28 is formed below the second photoelectric conversion layer 26. A second p$^+$-type GaN layer 30 is formed below the second p$^-$-type GaN layer 28. The second p$^-$-type GaN layer 28 and the second p$^+$-type GaN layer 30 contain, for example, Mg (magnesium) as a p-type impurity.

The p-type impurity concentration of the second p$^-$-type GaN layer 28 is, for example, $1\times10^{18}$ atoms/cm$^3$ to $1\times0^{18}$ atoms/cm$^3$. The p-type impurity concentration of the second p$^+$-type GaN layer 30 is, for example, $2\times10^{19}$ atoms/cm$^3$ to $1\times10^{20}$ atoms/cm$^3$.

A reflection layer 32 of, for example, a metal is formed below the second p$^+$-type GaN layer 30. Incident illumination light is reflected by the reflection layer of a metal, so that the efficiency of the photoelectric conversion element is improved. Particularly, it is desirable to use Ag (silver) as the reflection layer 32 because it has a high reflectivity to visible light.

A p-side electrode 34 is formed below the reflection layer 32. The p-side electrode 34 is a terminal that outputs a current obtained by photoelectric conversion. The p-side electrode 34 is, for example, a metal electrode, and can employ a laminated structure of, for example, Au (gold)/Ni (nickel) from the lower layer.

A heat dissipation layer 36 of, for example, a metal is formed below the p-side electrode 34. It is desirable to use Cu (copper), which has a high heat conductivity, as the heat dissipation layer 36.

Figure 2A:
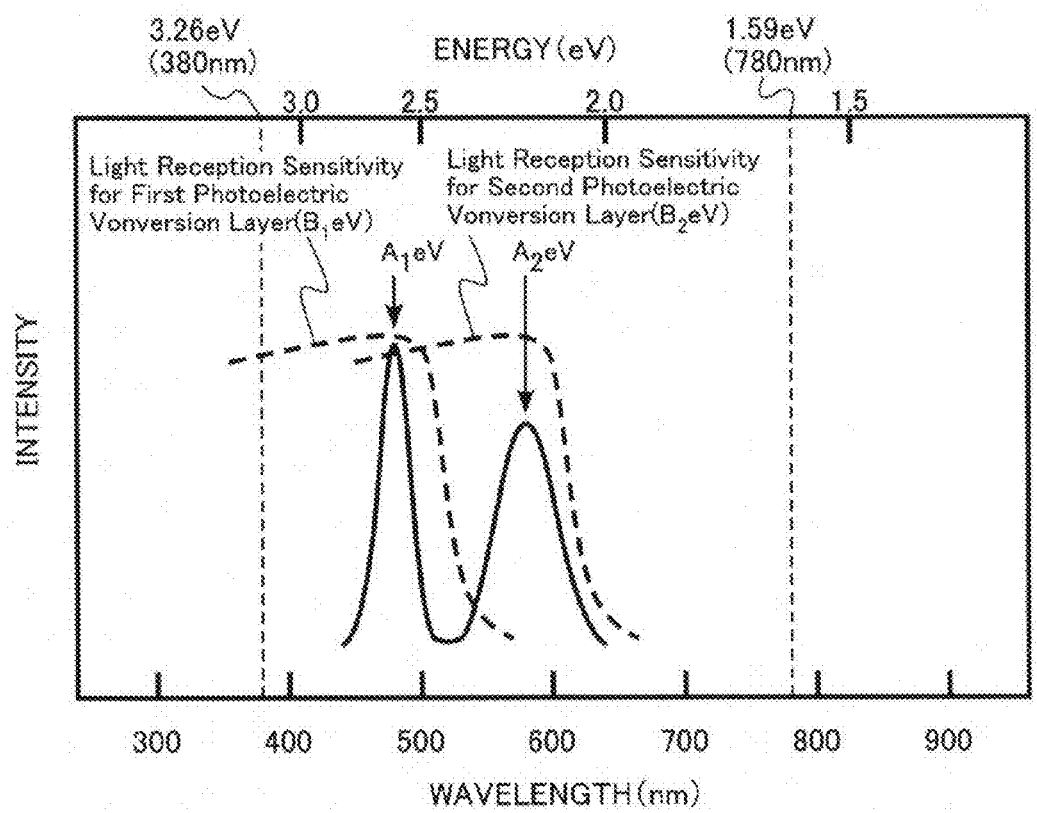
FIGS. 2A and 2B are views for explaining the structure and action of the photoelectric conversion element of the first embodiment.
Figure 2B:
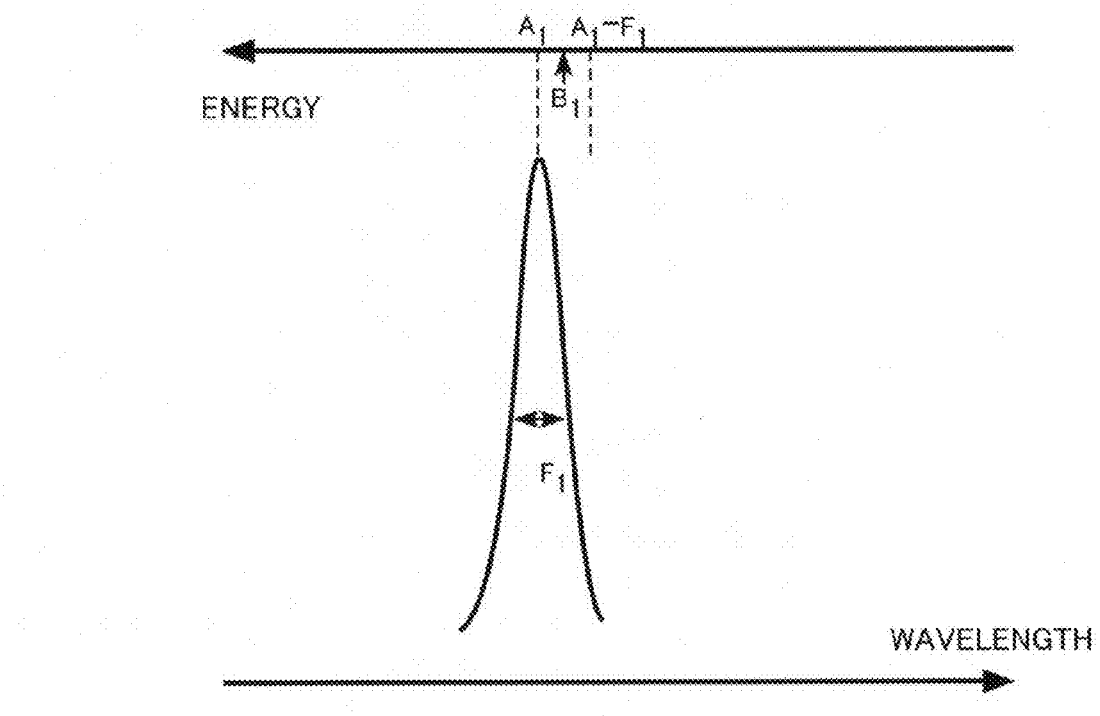

FIGS. 2A and 2B are views for explaining the structure and action of the photoelectric conversion element of the this embodiment. In this embodiment, the photoelectric conversion element is provided with a photoelectric conversion layer having, with respect to a peak energy Ap (eV) of a light emission peak of illumination light, a band gap energy Bq (eV) that is slightly lower the peak energy Ap (eV).

Specifically, a first photoelectric conversion layer 16 is provided which has, with respect to a first light emission peak having a peak energy $A_1$ (eV), a band gap energy $B_1$ (eV) that is slightly lower than the peak energy $A_1$ (eV). It is considered that consequently, as shown in FIG. 2A, the first light emission peak and the light reception sensitivity curve of the first photoelectric conversion layer 16 appropriately overlap each other, so that efficiency of photoelectric conversion by the first photoelectric conversion layer 16 is improved.

Similarly, a second photoelectric conversion layer 26 is provided which has, with respect to a second light emission peak having a peak energy $A_2$ (eV), a band gap energy $B_2$ (eV) that is slightly lower than the peak energy $A_2$ (eV). It is considered that consequently, efficiency of photoelectric conversion by the second photoelectric conversion layer 26 is improved.

The band gap energy $B_1$ of the first photoelectric conversion layer 16 is higher than the band gap energy $B_2$ of the second photoelectric conversion layer 26. That is, photoelectric conversion layers are arranged from the side at which illumination light is incident, in the descending order, with the highest the first, in terms of the band gap energy Bq (eV).

By making this arrangement, a portion of high energy in illumination light is photoelectrically converted by a photoelectric conversion layer having a high band gap energy. Therefore, energy loss during photoelectric conversion is eliminated, so that photoelectric conversion of high efficiency is achieved.

For the range of the band gap energy Bq (eV) of the photoelectric conversion layer, the relationship of Ap−Fp<Bq≤Ap is satisfied with a peak energy Ap (eV) and a full width at half maximum Fp (eV) of a light emission peak. In this embodiment, the relationship of $A_1-F_1<B_1 \leq A_1$ and $A_2-F_2<B_2 \leq A_2$ is satisfied.

By satisfying this relationship, high photoelectric conversion efficiency in the photoelectric conversion layer is achieved. FIG. 2B shows the above-described relationship with the first light emission peak and the first photoelectric conversion layer 16 as an example.

Figure 3:
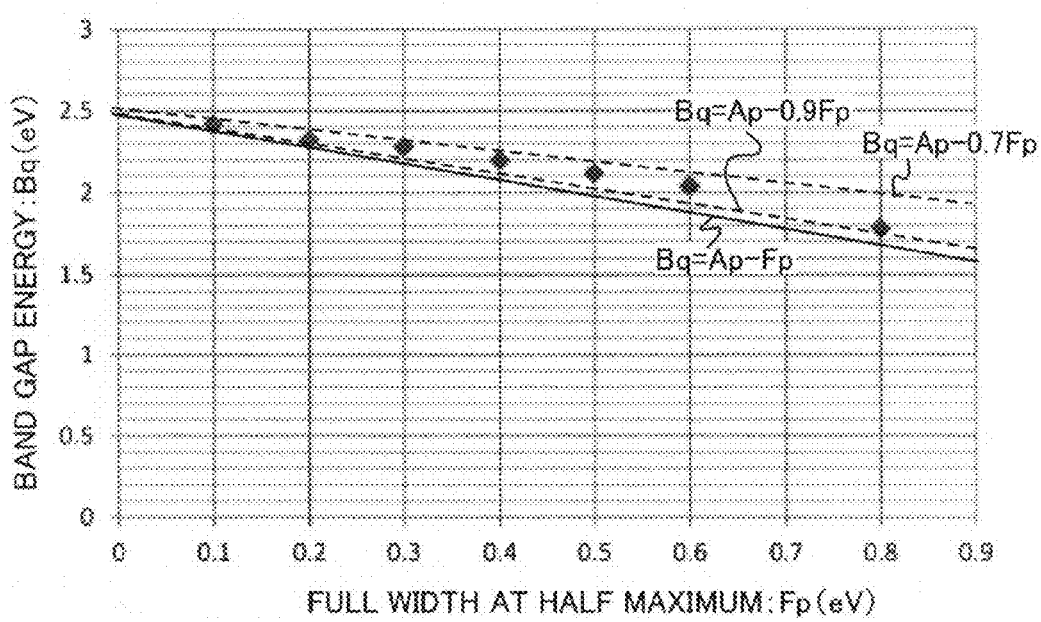
FIG. 3 shows a result of determining a relationship between a peak energy Ap (eV) and a full width at half maximum Fp (eV) of a light emission peak and a band gap energy Bq (eV) of a photoelectric conversion layer by simulation.

FIG. 3 shows a result of determining a relationship between a peak energy Ap (eV) and a full width at half maximum Fp (eV) of a light emission peak and a band gap energy Bq (eV) of a photoelectric conversion layer by simulation. A band gap energy Bq (eV) is determined at which photoelectric conversion efficiency is maximum when the peak energy Ap (eV) of the light emission peak is fixed at 2.5 eV and the full width at half maximum Fp (eV) is a variable.

The plot shows a band gap energy at which photoelectric conversion efficiency is maximum. As is apparent from the figure, the relationship of Ap−Fp<Bq≤Ap is satisfied for the band gap energy at which photoelectric conversion efficiency is maximum. Further, the band gap energy, at which photoelectric conversion efficiency is maximum, satisfies the relationship of Ap−0.9Fp<Bq<Ap−0.7Fp as well. Thus, it is desirable to satisfy the relationship of Ap−0.9Fp<Bq<Ap−0.7Fp for the band gap energy Bq (eV).

According to the photoelectric conversion element of this embodiment, a photoelectric conversion layer having a band gap energy optimized to a peak energy of a light emission peak of illumination light is provided, so that incident light energy can be efficiently converted into electric energy. Particularly, power generation of high efficiency can be performed in an indoor environment where an illuminator using a LED is installed.

Explanations are provided here taking as an example a case where when the number of light emission peaks is n and the number of photoelectric conversion layers is m, n and m each are 2, i.e. m=n. It is desirable to set m=n from the viewpoint of achieving high efficiency.

However, the relationship between m and n may be m≠n, for example as in a case where the number of light emission peaks is 3 (n=3) and the number of photoelectric conversion layers is 2 (m=2). For example, it is conceivable that 2 photoelectric conversion layers optimized to 2 light emission peaks having a high intensity in 3 light emission peaks are provided.

In this embodiment, the gradient of a plane direction of a surface with respect to a plane of lamination of a GaN-based semiconductor layer formed on a single-crystal silicon substrate 40 is, for example, 0 degree or more and 8 degrees or less. In this case, it is desirable to satisfy 0.1≤X1≤0.25 in the first photoelectric conversion layer 16 having a composition denoted as $In_{x1}Ga_{y1}Al_{z1}N$ (0<x1≤1, 0≤y1<1, 0≤z1<1 and x1+y1+z1≤1) and satisfy 0.15≤X2≤0.35 in the second photoelectric conversion layer 26 having a composition denoted as $In_{x2}Ga_{y2}Al_{z2}N$ (0<x2≤1, 0≤y2<1, 0≤z2<1 and x2+y2+z2≤1). By ensuring that the composition of In is in the above-described range, conversion efficiency with respect to blue light and yellow light is optimized.

However, the gradient of a plane direction of a surface with respect to a plane of lamination of a GaN-based semiconductor layer formed on the single-crystal silicon substrate 40 is desirable to 15 degree or more and 65 degrees or less from the viewpoint of improving photoelectric conversion efficiency. In this case, it is desirable to satisfy 0.2≤X1≤0.4 in the first photoelectric conversion layer 16 having a composition denoted as $In_{x1}Ga_{y1}Al_{z1}N$ (0<x1≤1, 0≤y1<1, 0≤z1<1 and x1+y1+z1≤1) and satisfy 0.25≤X2≤0.60 in the second photoelectric conversion layer 26 having a composition denoted as $In_{x2}Ga_{y2}Al_{z2}N$ (0<x2≤1, 0≤y2<1, 0≤z2<1 and x2+y2+z2≤1). By ensuring that the composition of In is in the above-described range, conversion efficiency with respect to blue light and yellow light is optimized.

Al (aluminum) may be included in the first or second photoelectric conversion layer 16 or 26. By including Al, the integrity of lattices or band gap energy can be adjusted. By including Al, crystallinity can be improved.

A material having a composition other than the composition denoted as $In_xGa_yAl_zN$ (0<x≤1, 0≤y<1, 0≤z<1 and x+y+z≤1) can also be applied to the photoelectric conversion layer. However, the material having the above-described composition is a desirable material for power generation in indoor illumination using a LED because photoelectric conversion efficiency in the visible light region is high.

A method for manufacturing a photoelectric conversion element of this embodiment will now be described. The method for manufacturing a photoelectric conversion element of this embodiment includes forming a GaN-based n-type semiconductor layer on a substrate; forming on the n-type semiconductor layer a first photoelectric conversion layer having a composition denoted as $In_{x1}Ga_{y1}Al_{z1}N$ (0<x1≤1, 0≤y1<1, 0≤z1<1 and x1+y1+z1≤1); forming on the first photoelectric conversion layer a second photoelectric conversion layer having a composition denoted as $In_{x2}Ga_{y2}Al_{z2}N$ (0<x2≤1, 0≤y2<1, 0≤z2<1 and x2+y2+z2≤1) wherein x1<x2; forming a GaN-based p-type semiconductor layer on the second photoelectric conversion layer; forming a p-side electrode on the p-type semiconductor layer; removing the substrate to expose the n-type semiconductor layer; and forming an n-side electrode on the n-type semiconductor layer on a side opposite to the first photoelectric conversion layer.

FIGS. 4, 5, 6 and 7 are sectional schematic views showing the method for manufacturing a photoelectric conversion element of this embodiment.

First, for example, a single-crystal silicon substrate 40 having a thickness of about 500 μm is provided, and carried in a MOCVD device. Next, an AlN buffer layer 11, a first n$^+$-type GaN (gallium nitride) layer 12 and a first n$^-$-type GaN layer 14 are formed on the single-crystal silicon substrate 40 by a MOCVD (Metal Organic Chemical Vapor Deposition) method.

The AlN buffer layer 11, the first n$^+$-type GaN (gallium nitride) layer 12 and the first n$^-$-type GaN layer 14 are crystal-grown with TMG (trimethyl gallium) and NH$_3$ as a raw material gas, for example, under heated conditions at 1000° C. to 1100° C. SiH$_4$ (silane) is used for introduction of Si as an n-type impurity.

After formation of the n⁻-type GaN layer 14, TMI (trimethyl indium) is added to the raw material gas to form a first photoelectric conversion layer 16 of, for example, In$_{0.15}$Ga$_{0.85}$N (indium gallium nitride).

Figure 4:
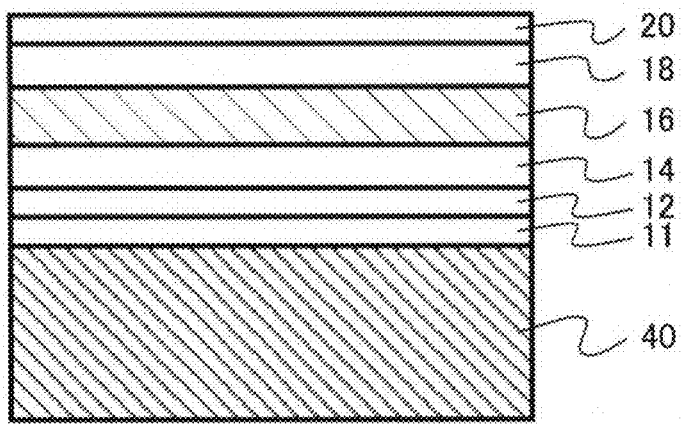
FIG. 4 is a sectional schematic view showing a method for manufacturing a photoelectric conversion element of the first embodiment.
Figure 5:
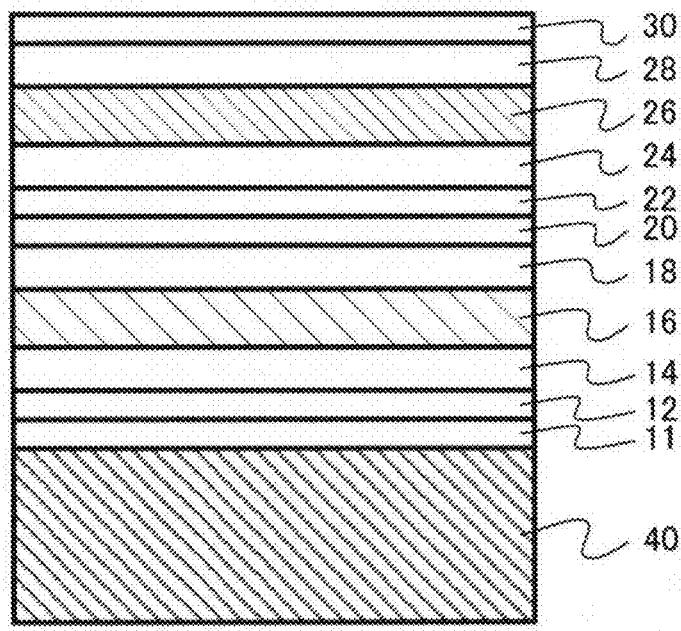
FIG. 5 is a sectional schematic view showing the method for manufacturing a photoelectric conversion element of the first embodiment.

After formation of the first photoelectric conversion layer 16, a first p⁻-type GaN layer 18 and a first p⁺-type GaN layer 20 are formed. The first p⁻-type GaN layer 18 and the first p⁺-type GaN layer 20 are crystal-grown with TMG (trimethyl gallium) and NH$_3$ as a raw material gas under heated conditions at 1000° C. Cp2Mg (cyclopentadienyl magnesium) is used for introduction of Mg as a p-type impurity (FIG. 4).

After formation of the first p⁺-type GaN layer 20, a second n⁺-type GaN layer 22, a second n⁻-type GaN layer 24, a second photoelectric conversion layer 26, a second p⁻-type GaN layer 28 and a second p⁺-type GaN layer 30 are formed (FIG. 5) by a process similar to the above-described process for forming the first p⁺-type GaN layer 20 from the first n⁺-type GaN (gallium nitride) layer 12.

The second photoelectric conversion layer 26 is, for example, In$_{0.25}$Ga$_{0.75}$N. The second photoelectric conversion layer 26 contains In (indium) in a concentration higher than that of the first photoelectric conversion layer 16. That is, the first photoelectric conversion layer 16 is a photoelectric conversion layer having a band gap energy greater than that of the second photoelectric conversion layer 26.

After formation of the second p⁺-type GaN layer 30, the single-crystal silicon substrate 40 is taken out from the MOCVD device. A reflection layer 32 and a p-side electrode 34 are formed on the second p⁺-type GaN layer 30.

The reflection layer 32 is, for example, Ag (silver), and the p-side electrode 34 is, for example, a laminated film of Ni (nickel)/Au (gold) from the reflection layer 32. The reflection layer 32 and the p-side electrode 34 are formed by, for example, an electron beam vapor deposition method in an electron beam vapor deposition device.

Next, a Cu (copper) substrate 36 having a size similar to that of the single-crystal silicon substrate 40 is provided. For example a SnAgCu solder (not shown) is deposited on the Cu substrate 36.

Figure 6:
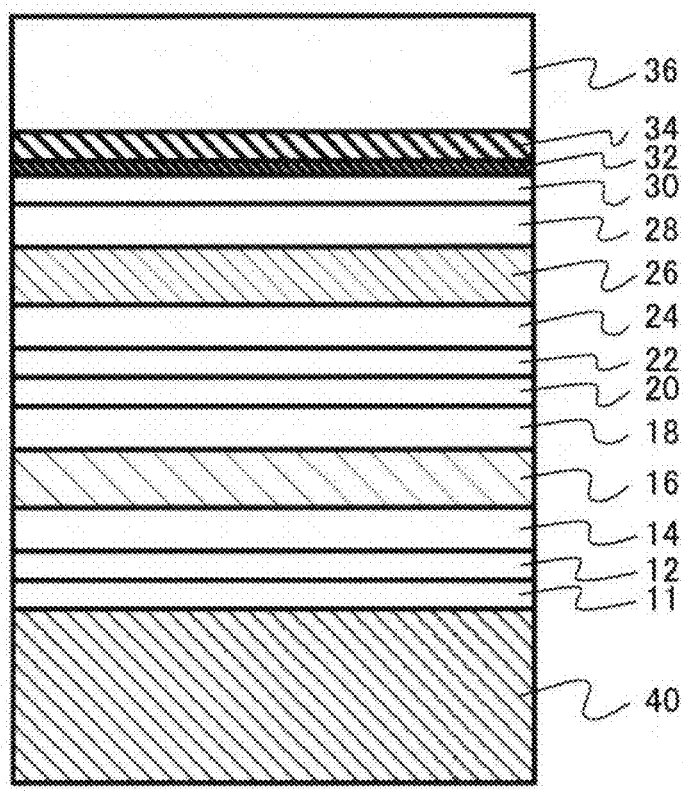
FIG. 6 is a sectional schematic view showing the method for manufacturing a photoelectric conversion element of the first embodiment.

Thereafter, the Cu substrate 36 and the p-side electrode 34 are superimposed on each other with the SnAgCu solder held therebetween, and laminated together by heating to, for example, 270° C. while a pressure is applied in a vacuum (FIG. 6).

Figure 7:
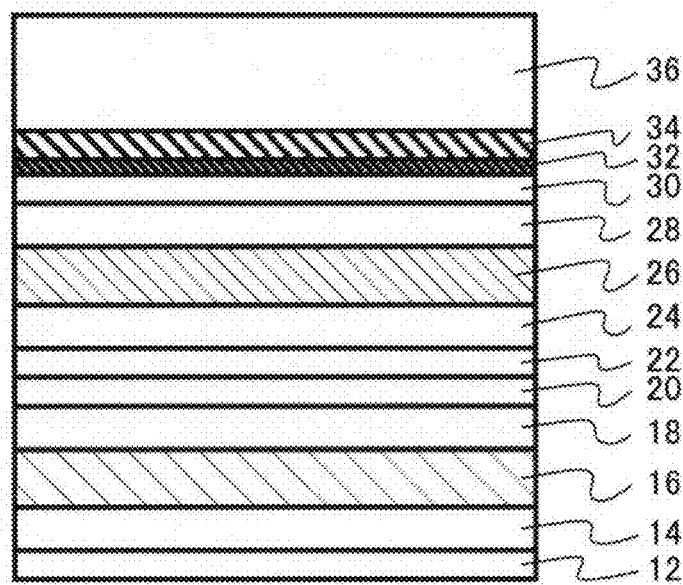
FIG. 7 is a sectional schematic view showing the method for manufacturing a photoelectric conversion element of the first embodiment.

Next, the single-crystal silicon substrate 40 is thinned to a thickness of about 50 μm by, for example, polishing it by a polishing machine. Thereafter, the single-crystal silicon substrate 40 is removed in its entirety by a dry etching device using a CF$_4$ (methane tetrafluoride) gas as a dry etching gas. Thereafter, the dry etching gas is changed to Cl$_2$ (chlorine), and the AlN buffer layer 11 is etched to expose the first n⁺-type GaN (gallium nitride) layer 12 (FIG. 7).

Thereafter, the surface of the first n⁺-type GaN (gallium nitride) layer 12 is etched with KOH (potassium hydroxide) to form an unevenness on the surface. After a rinsing treatment, an n-side electrode 10 is formed on the surface of the first n⁺-type GaN (gallium nitride) layer 12. The n-side electrode 10 is, for example, a laminated film of Ti (titanium)/Pt (platinum)/Au (gold) from, for example, the first n⁺-type GaN (gallium nitride) layer 12 side.

By the above step, the photoelectric conversion element shown in FIG. 1 can be formed.

Figure 8A:
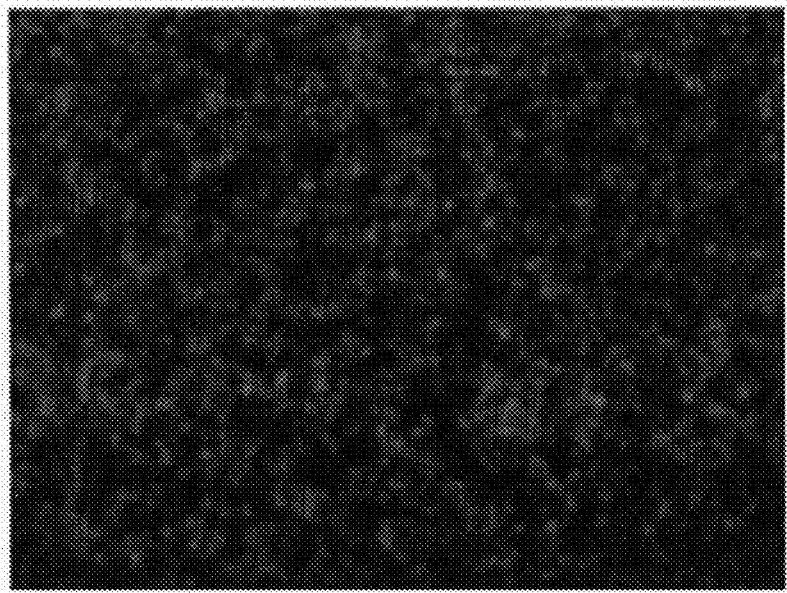
FIGS. 8A and 8B are views showing degradation of an InGaN layer by heating at 1000° C.
Figure 8B:
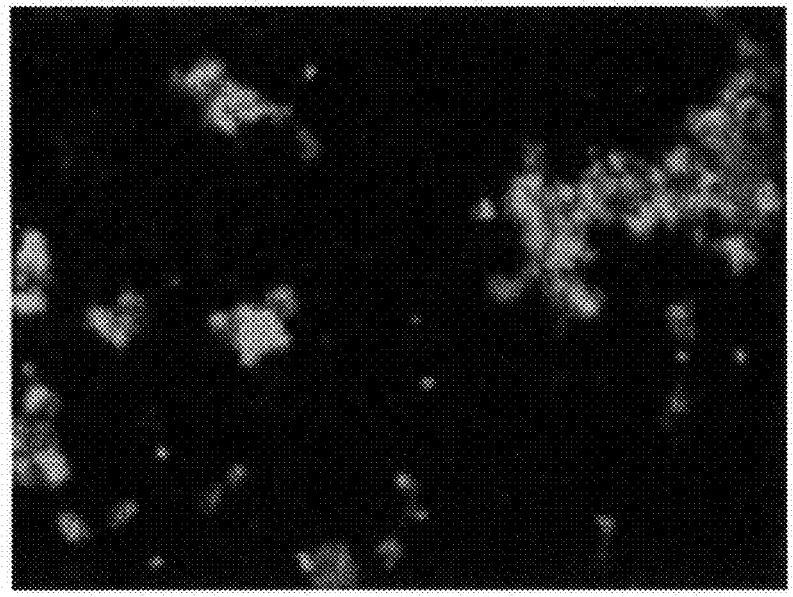

FIGS. 8A and 8B are views showing degradation of an InGaN layer by heating at 1000° C. A sample is irradiated with ultraviolet rays, a fluorescence is observed, and degradation of crystallinity is evaluated by light emission unevenness.

FIG. 8A shows a state before heating, and FIG. 8B shows a state after heating. Uniform light emission is observed before heating, whereas light emission unevenness is significant after heating, and it is apparent that the crystallinity of the InGaN layer is degraded. As a result of studies by the present disclosure, it has been found that degradation of characteristics is significant particularly in the case of a high concentration of In (indium) (high composition).

It has become evident that degradation depends on the heating temperature and heating time, and an InGaN layer having a higher In composition is degraded at a lower temperature and in a shorter time. When the crystallinity of the InGaN layer is degraded, the photoelectric conversion efficiency of the photoelectric conversion element is deteriorated.

According to this embodiment, the first photoelectric conversion layer 16 as an InGaN layer having a low In composition is first formed, and the second photoelectric conversion layer 26 as an InGaN layer having a high In composition is then formed. Therefore, degradation of the photoelectric conversion layer by the heat treatment during film formation can be suppressed to achieve high photoelectric conversion efficiency.

It has been found that when a p-side electrode is formed on a p-type GaN layer, the crystallinity of the surface of the p-side GaN layer is important. That is, if the crystallinity of the surface of the p-side GaN layer is disordered, the contact resistance of the p-side electrode increases particularly when the p-side electrode is a metal. Therefore, such a problem arises that particularly when processing with accelerated particles, such as dry etching, or polishing processing is carried out for surface processing of the p-side GaN layer, the contact resistance is significantly increased.

According to this embodiment, it is required to carry out dry etching or polishing processing for removing the substrate on the p-type GaN layer, or the like, but by using the present structure, the p-side electrode can be formed without carrying out such processing. Therefore, a p-side electrode having a low contact resistance can be achieved. Accordingly, a photoelectric conversion element with a low resistance loss and high efficiency can be achieved.

In place of a single-crystal silicon substrate, any other substrate capable of forming a semiconductor layer on the substrate can also be used.

Second Embodiment

A photoelectric conversion element of this embodiment is same as that of the first embodiment except that the photoelectric conversion element includes three photoelectric conversion layers. Therefore, descriptions of matters that are in common with the first embodiment are omitted.

The photoelectric conversion element of this embodiment is structured to adapt to illumination light emitted from, for example, a white light illuminator including a blue LED, of which the wavelength $\lambda_1$ of the light emission peak is 450 nm ($A_1$=2.76 eV), a green LED, of which the wavelength $\lambda_2$ of the light emission peak is 520 nm ($A_2$=2.38 eV), and a red LED, of which the wavelength $\lambda_3$ of the light emission peak is 630 nm ($A_2$=1.97 eV). That is, the photoelectric conversion element is a photoelectric conversion element which performs photoelectric conversion by receiving illumination light having three light emission peaks: a first light emission peak having a peak energy $A_1$ of 2.76 eV, a second light emission peak having a peak energy $A_2$ of 2.38 eV and a third light emission peak having a peak energy $A_2$ of 1.97 eV.

Here, the first light emission peak has a full width at half maximum $F_1$ (eV), the second light emission peak has a full width at half maximum $F_2$ (eV), and the third light emission peak has a full width at half maximum $F_3$ (eV).

The photoelectric conversion element of this embodiment includes an n-side electrode formed on a side at which illumination light is incident; a GaN-based n-type semiconductor layer formed below the n-side electrode; a first photoelectric conversion layer formed below the n-type semiconductor layer and having a composition denoted as $In_{x1}Ga_{y1}Al_{z1}N$ ($0<x1\leq 1$, $0\leq y1<1$, $0\leq z1<1$ and $x1+y1+z1\leq 1$); a second photoelectric conversion layer formed below the first photoelectric conversion layer and having a composition denoted as $In_{x2}Ga_{y2}Al_{z2}N$ ($0<x2\leq 1$, $0\leq y2<1$, $0\leq z2<1$ and $x2+y2+z2\leq 1$) wherein $x1<x2$; a third photoelectric conversion layer formed below the second photoelectric conversion layer and having a composition denoted as $In_{x3}Ga_{y3}Al_{z3}N$ ($0<x3\leq 1$, $0\leq y3<1$, $0\leq z3<1$ and $x3+y3+z3\leq 1$) wherein $x2<x3$; a GaN-based p-type semiconductor layer formed below the third photoelectric conversion layer; and a p-side electrode formed below the p-type semiconductor layer.

Figure 9:
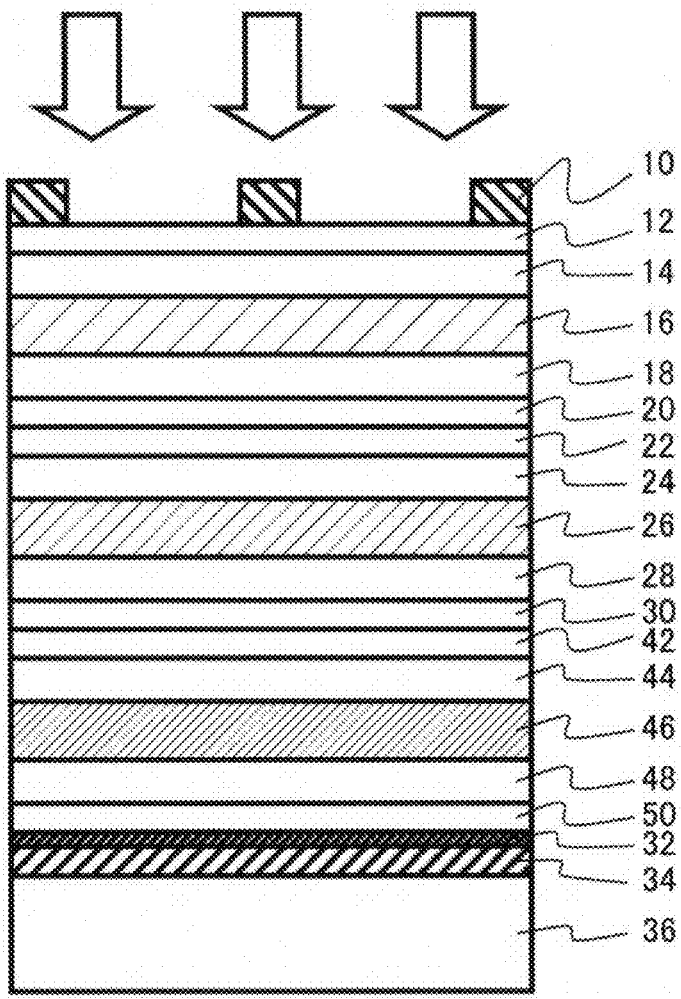
FIG. 9 is a sectional schematic view of a photoelectric conversion element of a second embodiment.

FIG. 9 is a sectional schematic view of a photoelectric conversion element of this embodiment. In the photoelectric conversion element of this embodiment, an n-side electrode 10 is formed on a side at which illumination light shown by white arrows in the figure is incident (upper side in FIG. 1).

A first n$^+$-type GaN (gallium nitride) layer 12 is formed below the n-side electrode 10. A first n$^-$-type GaN layer 14 is formed below the first n$^+$-type GaN layer 12. The first n$^+$-type GaN layer 12 and the first n$^-$-type GaN layer 14 contain, for example, Si (silicon) as an n-type impurity.

A first photoelectric conversion layer 16 of, for example, $In_{0.15}Ga_{0.85}N$ (indium gallium nitride) is formed below the first n$^-$-type GaN layer 14. Here, the first photoelectric conversion layer 16 has a band gap energy $B_1$ (eV).

A first p$^-$-type GaN layer 18 is formed below the first photoelectric conversion layer 16. A first p$^+$-type GaN layer 20 is formed below the first p$^-$-type GaN layer 18. The first p$^-$-type GaN layer 18 and the first p$^+$-type GaN layer 20 contain, for example, Mg (magnesium) as a p-type impurity.

A second n$^+$-type GaN layer 22 is formed below the first p$^+$-type GaN layer 20. A second n$^-$-type GaN layer 24 is formed below the second n$^+$-type GaN layer 22. The second n$^+$-type GaN layer 22 and the second n$^-$-type GaN layer 24 contain, for example, Si (silicon) as an n-type impurity.

A second photoelectric conversion layer 26 of, for example, $In_{0.20}Ga_{0.80}N$ is formed below the second n$^-$-type GaN layer 24. Here, the second photoelectric conversion layer 26 has a band gap energy $B_2$ (eV).

A second p$^-$-type GaN layer 28 is formed below the second photoelectric conversion layer 26. A second p$^+$-type GaN layer 30 is formed below the second p$^-$-type GaN layer 28. The second p$^-$-type GaN layer 28 and the second p$^+$-type GaN layer 30 contain, for example, Mg (magnesium) as a p-type impurity.

A third n$^+$-type GaN layer 42 is formed below the second p$^+$-type GaN layer 30. A third n$^-$-type GaN layer 44 is formed below the third n$^+$-type GaN layer 42. The third n$^+$-type GaN layer 42 and the third n$^-$-type GaN layer 44 contain, for example, Si (silicon) as an n-type impurity.

A third photoelectric conversion layer 46 of, for example, $In_{0.30}Ga_{0.70}N$ is formed below the third n$^-$-type GaN layer 44. Here, the third photoelectric conversion layer 46 has a band gap energy $B_3$ (eV).

A third p$^-$-type GaN layer 48 is formed below the third photoelectric conversion layer 46. A third p$^+$-type GaN layer 50 is formed below the third p$^-$-type GaN layer 48. The third p$^-$-type GaN layer 48 and the third p$^+$-type GaN layer 50 contain, for example, Mg (magnesium) as a p-type impurity.

A reflection layer 32 of, for example, a metal is formed below the third p$^+$-type GaN layer 50. Incident illumination light is reflected by the reflection layer of a metal, so that the efficiency of the photoelectric conversion element is improved. Particularly, it is desirable to use Ag (silver) as the reflection layer 32 because it has a high reflectivity to visible light.

A p-side electrode 34 is formed below the reflection layer 32. The p-side electrode 34 is a terminal that outputs a current obtained by photoelectric conversion.

A heat dissipation layer 36 of, for example, a metal is formed below the p-side electrode 34.

The band gap energy $B_1$ of the first photoelectric conversion layer 16 is higher than the band gap energy $B_2$ of the second photoelectric conversion layer 26, and the band gap energy $B_2$ of the second photoelectric conversion layer 26 is higher than the band gap energy $B_3$ of the third photoelectric conversion layer 46. That is, photoelectric conversion layers are arranged from the side at which illumination light is incident, in the descending order, with the highest the first, in terms of the band gap energy Bq (eV).

By making this arrangement, a portion of high energy in illumination light is photoelectrically converted by a photoelectric conversion layer having a high band gap energy. Therefore, energy loss during photoelectric conversion is eliminated, so that photoelectric conversion of high efficiency is achieved.

For the range of the band gap energy Bq (eV) of the photoelectric conversion layer, the relationship of $Ap-Fp<Bq\leq Ap$ is satisfied with a peak energy Ap (eV) and a full width at half maximum Fp (eV) of a light emission peak. By satisfying this relationship, high photoelectric conversion efficiency in the photoelectric conversion layer is achieved. In this embodiment, the relationship of $A_1-F_1<B_1\leq A_1$, $A_2-F_2<B_2\leq A_2$ and $A_3-F_3<B_3\leq A_3$ is satisfied.

According to the photoelectric conversion element of this embodiment, three photoelectric conversion layers having a band gap energy optimized to the peak energy of three light emission peaks of illumination light are provided. Therefore, incident light energy can be efficiently converted. Particularly, power generation of high efficiency can be performed in an indoor environment where an illuminator using a LED is installed.

The photoelectric conversion element of this embodiment can be produced by a method similar to the production method described in the first embodiment.

Third Embodiment

A photoelectric conversion system of this embodiment includes an illuminator having n light emission peaks having a peak energy Ap (eV) (where $1\leq p\leq n$ and $2\leq n$) of $1.59\leq Ap\leq 3.26$ and a full width at half maximum Fp (eV) (where $1\leq p\leq n$ and $2\leq n$); and an electronic device having a photoelectric conversion element, wherein the photoelectric conversion element includes m photoelectric conversion layers having a band gap energy Bq (eV) (where $1\leq q\leq m$ and $2\leq m\leq n$), and the m photoelectric conversion layers each satisfy the relationship of $Ap-Fp<Bq\leq Ap$ with respect to any one of the n light emission peaks. The structure of the photoelectric element is similar to that in the first embodiment.

Therefore, descriptions of matters that are in common with the first embodiment are omitted.

Figure 10:
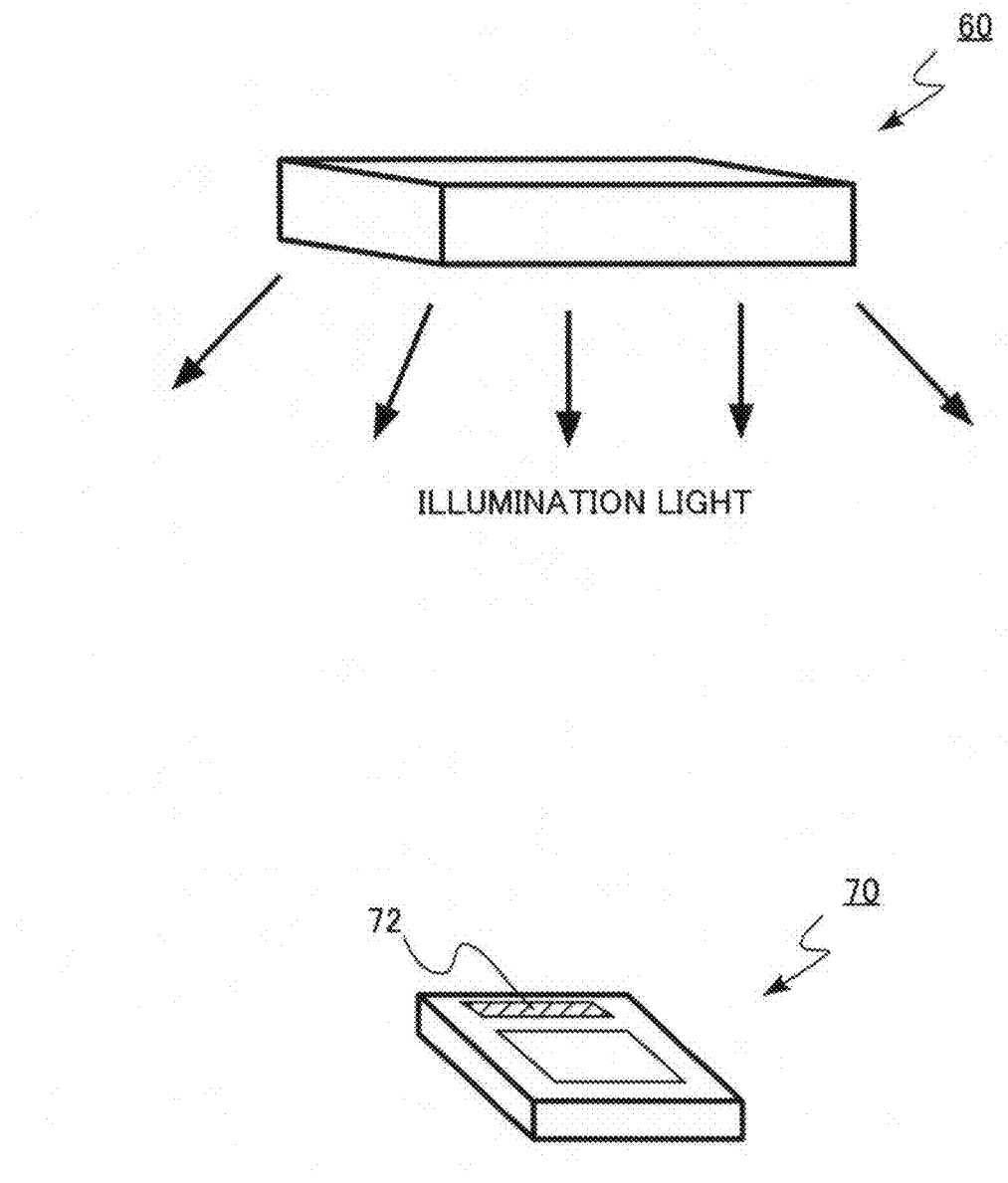
FIG. 10 is a schematic view of a photoelectric conversion system of a third embodiment.

FIG. 10 is a schematic view of the photoelectric conversion system of this embodiment. The photoelectric conversion system of this embodiment includes an illuminator 60 and an electronic device 70.

The illuminator 60 is, for example, an illuminator in an office or a factory, which uses a LED (Light Emitting Diode). The illuminator is, for example, a white light illuminator including a blue LED, of which the wavelength $\lambda_1$ of the light emission peak is 450 nm ($A_1$=2.76 eV), and a yellow LED, of which the wavelength $\lambda_2$ of the light emission peak is 560 nm ($A_2$=2.21 eV).

The electronic device 70 is, for example, a portable information device such as a smart phone. The electronic device 70 includes a photoelectric conversion element 72. The photoelectric conversion element 72 photoelectrically converts illumination light from the illuminator 60 to generate electric power.

The photoelectric conversion element 72 is structured to adapt to illumination light emitted from, for example, a white light illuminator including a blue LED, of which the wavelength $\lambda_1$ of the light emission peak is 450 nm ($A_1$=2.76 eV), and a yellow LED, of which the wavelength $\lambda_2$ of the light emission peak is 560 nm ($A_2$=2.21 eV). That is, the photoelectric conversion element is a photoelectric conversion element which performs photoelectric conversion by receiving illumination light having two light emission peaks: a first light emission peak having a peak energy $A_1$ of 2.76 eV and a second light emission peak having a peak energy $A_2$ of 2.21 eV.

Here, the first light emission peak has a full width at half maximum $F_1$ (eV), and the second light emission peak has a full width at half maximum $F_2$ (eV). For the range of the band gap energy Bq (eV) of the photoelectric conversion layer, the relationship of Ap−Fp<Bq≤Ap is satisfied with a peak energy Ap (eV) and a full width at half maximum Fp (eV) of a light emission peak. In this embodiment, the relationship of $A_1-F_1<B_1 \leq A_1$ and $A_2-F_2<B_2 \leq A_2$ is satisfied.

According to this embodiment, a high-efficiency photoelectric conversion system can be achieved by optimizing the light emission characteristics of the illuminator and the photoelectric conversion element characteristics of the electronic device. Therefore, power generation of high efficiency with indoor illumination light having a light intensity lower than that of sunlight is possible and for example, the usefulness of the portable information device is enhanced.

An example of this embodiment will be described below. The illuminator 60 has light emission peaks of four different wavelengths. The illuminator 60 may become an illuminator having the best efficiency by adjusting full width at half maximum of light emission peaks of LED and a range of wavelength of visible light. Peaks of the emission wavelength are 450 nm, 535 nm, 590 nm, 605 nm (2.57 eV, 2.32 eV, 2.10 eV, 2.05 eV). Good color rendering characteristics and high efficiency can be achieved by making full width at half maximum of the peaks 20 nm. Theoretically, 390 lm/W can be achieved. Band gaps of an photoelectric conversion element 72 which receives light from the illuminator 60 will be 2.57 eV, 2.32 eV, 2.10 eV, 2.05 eV which is same as that of the emission layers of the illuminator 60. Because they have same band gaps, same materials can be used for the emission layers of the illuminator 60 and the photoelectric conversion layers of the photoelectric conversion element 72. More preferably, band gaps of the photoelectric conversion layers of the photoelectric conversion element 72 are 2.66 eV, 2.25 eV, 2.04 eV, 2.00 eV. With the band gaps, more efficient power generation will be possible. This is due to relation between a shape of emission spectrum and a shape of absorption spectrum. In Gallium Nitride semiconductor material, a quantum confined stark effect (QCSE) which is a narrowing of band gap from inherent band gap due to internal electric field in the material will occur when InGaN layers are used for emission layers or photoelectric conversion layers. In this case, a wave length of emission becomes shorter than that of absorption by a screening effect due to carrier injection. In InGaN material, a band tail level may be generated due to micro-scale high In concentration regions generated in the material which are caused by low mixing ability of In in GaN. In LED, recombination of carriers in this band tail level may be low level injection. In this case, a peak of emission light will be at longer side. Such various phenomena may be observed in the photoelectric conversion element 72. In conclusion, high efficient photoelectric conversion element can be achieved by making the range of the band gap energy Bq (eV) of the photoelectric conversion layer of the photoelectric conversion element to satisfy the relationship of Ap−Fp<Bq≤Ap, more preferably Ap−0.9Fp<Bq<Ap−0.7Fp, with a peak energy Ap (eV) and a full width at half maximum Fp (eV) of a light emission peak of the illuminator.

Fourth Embodiment

A method for manufacturing a photoelectric conversion element of this embodiment is same as that of the first embodiment except that a semiconductor layer on a substrate is formed by a DC sputtering method rather than a MOCVD method. Therefore, descriptions of matters that are in common with the first embodiment are omitted. The structure of the photoelectric element is similar to that in the first embodiment.

The production method of this embodiment will be described with reference to FIGS. 4, 5, 6 and 7.

First, for example, a single-crystal silicon substrate 40 having a thickness of about 500 μm is provided, and carried in a DC sputtering device. Next, an AlN buffer layer 11, a first n$^+$-type GaN (gallium nitride) layer 12 and a first n$^-$-type GaN layer 14 are formed on the single-crystal silicon substrate 40 by a DC sputtering method.

The AlN buffer layer 11, the first n$^+$-type GaN (gallium nitride) layer 12 and the first n$^-$-type GaN layer 14 are crystal-grown with a GaN sintered body as a raw material, for example, under heated conditions at 800° C. to 900° C. Si is used for an n-type impurity.

After formation of the n$^-$-type GaN layer 14, a GaN sintered body and an InN sintered body are co-sputtered to form a first photoelectric conversion layer 16 of, for example, $In_{0.15}Ga_{0.85}N$ (indium gallium nitride).

After formation of the first photoelectric conversion layer 16, a first p$^-$-type GaN layer 18 and a first p$^+$-type GaN layer 20 are formed. The first p$^-$-type GaN layer 18 and the first p$^+$-type GaN layer 20 are crystal-grown under heated conditions at 800° C. to 900° C. using as a raw material a GaN sintered body containing Mg (FIG. 4).

After formation of the first p$^+$-type GaN layer 20, a second n$^+$-type GaN layer 22, a second n$^-$-type GaN layer 24, a second photoelectric conversion layer 26, a second p$^-$-type GaN layer 28 and a second p$^+$-type GaN layer 30 are formed (FIG. 5) by a process similar to the above-described process for forming the first p$^+$-type GaN layer 20 from the first n$^+$-type GaN (gallium nitride) layer 12.

The second photoelectric conversion layer 26 is, for example, $In_{0.25}Ga_{0.75}N$. The second photoelectric conversion layer 26 contains In (indium) in a concentration higher than that of the first photoelectric conversion layer 16. That is, the first photoelectric conversion layer 16 is a photoelectric conversion layer having a band gap energy greater than that of the second photoelectric conversion layer 26.

After formation of the second p$^+$-type GaN layer 30, the single-crystal silicon substrate is taken out from the DC sputtering device. A reflection layer 32 and a p-side electrode 34 are formed on the second p$^+$-type GaN layer 30. Subsequent steps are same as those in the first embodiment (FIGS. 6 and 7).

According to this embodiment, a high-efficiency photoelectric conversion element can be produced by a more inexpensive method as compared to the first embodiment.

Fifth Embodiment

A method for manufacturing a photoelectric conversion element of this embodiment includes forming a GaN-based first p-type semiconductor layer on a substrate; forming on the first p-type semiconductor layer a first photoelectric conversion layer having a composition denoted as $In_{x1}Ga_{y1}Al_{Z1}N$ ($0<x1\leq1$, $0\leq y1<1$, $0\leq z1<1$ and $x1+y1+z1\leq1$); forming on the first photoelectric conversion layer a second photoelectric conversion layer having a composition denoted as $In_{x2}Ga_{y2}Al_{Z2}N$ ($0<x2\leq1$, $0\leq y2<1$, $0\leq z2<1$ and $x2+y2+z2\leq1$) wherein $x1<x2$; forming a GaN-based n-type semiconductor layer on the second photoelectric conversion layer; forming an n-side electrode on the n-type semiconductor layer; removing the substrate to expose the first p-type semiconductor layer; further forming a second p-type semiconductor layer on the first p-type semiconductor layer on a side opposite to the first photoelectric conversion layer; and forming a p-side electrode on the second p-type semiconductor layer on a side opposite to the first photoelectric conversion layer.

Figure 11:
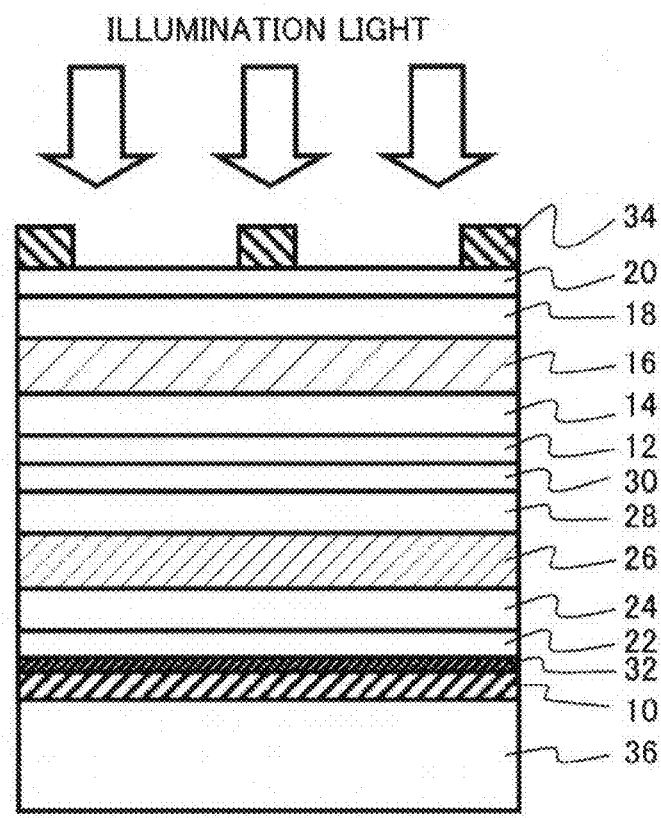
FIG. 11 is a sectional schematic view of a photoelectric conversion element produced in a fifth embodiment.

FIG. 11 is a sectional schematic view of the photoelectric conversion element produced in this embodiment. It is different from the photoelectric conversion element of the first embodiment shown in FIG. 1 in that the p-side electrode is formed on a side at which illumination light is incident.

That is, the photoelectric conversion element of this embodiment is structured to adapt to illumination light emitted from, for example, a white light illuminator including a blue LED, of which the wavelength $\lambda_1$ of the light emission peak is 450 nm ($A_1$=2.76 eV), and a yellow LED, of which the wavelength $\lambda_2$ of the light emission peak is 560 nm ($A_2$=2.21 eV). That is, the photoelectric conversion element is a photoelectric conversion element which performs photoelectric conversion by receiving illumination light having two light emission peaks: a first light emission peak having a peak energy $A_1$ of 2.76 eV and a second light emission peak having a peak energy $A_2$ of 2.21 eV.

Here, the first light emission peak has a full width at half maximum $F_1$ (eV), and the second light emission peak has a full width at half maximum $F_2$ (eV).

In the photoelectric conversion element of this embodiment, an p-side electrode 34 is formed on a side at which illumination light shown by white arrows in the figure is incident (upper side in FIG. 11). The p-side electrode 34 is a terminal that outputs a current obtained by photoelectric conversion. The p-side electrode 34 is, for example, a metal electrode, and can employ, for example, a laminated structure of Ni (nickel)/Au (gold) from the semiconductor layer side.

A first p$^+$-type GaN layer 20 is formed below the p-side electrode 34. A first p$^-$-type GaN layer 18 is formed below the first p$^+$-type GaN layer 20. The first p$^+$-type GaN layer 20 and the first p$^-$-type GaN layer 18 contain, for example, Mg (magnesium) as a p-type impurity.

The p-type impurity concentration of the first p$^-$-type GaN layer 18 is, for example, 1×10$^{18}$ atoms/cm$^3$ to 1×10$^{19}$ atoms/cm$^3$. The p-type impurity concentration of the first p$^+$-type GaN layer 20 is, for example, 2×10$^{19}$ atoms/cm$^3$ to 1×10$^{20}$ atoms/cm$^3$.

A first photoelectric conversion layer 16 of, for example, $In_{0.15}Ga_{0.85}N$ (indium gallium nitride) is formed below the first p$^-$-type GaN layer 18. Here, the first photoelectric conversion layer 16 has a band gap energy $B_1$ (eV).

A first n$^-$-type GaN layer 14 is formed below the first photoelectric conversion layer 16. A first n$^+$-type GaN layer 12 is formed below the first n$^-$-type GaN layer 14. The first n$^+$-type GaN layer 12 and the first n$^-$-type GaN layer 14 contain, for example, Si (silicon) as an n-type impurity.

The n-type impurity concentration of the first n$^+$-type GaN layer 12 is, for example, 2×10$^{19}$ atoms/cm$^3$ to 1×10$^{20}$ atoms/cm$^3$. The n-type impurity concentration of the first n$^-$-type GaN layer 14 is, for example, 1×10$^{18}$ atoms/cm$^3$ to 1×10$^{19}$ atoms/cm$^3$.

A second p$^+$-type GaN layer 30 is formed below the first n$^+$-type GaN layer 12. A second p$^-$-type GaN layer 28 is formed below the second p$^+$-type GaN layer 30. The second p$^+$-type GaN layer 30 and the second p$^-$-type GaN layer 28 contain, for example, Mg (magnesium) as a p-type impurity.

The p-type impurity concentration of the second p$^-$-type GaN layer 28 is, for example, 1×10$^{18}$ atoms/cm$^3$ to 1×10$^{19}$ atoms/cm$^3$. The p-type impurity concentration of the second p$^+$-type GaN layer 30 is, for example, 2×10$^{19}$ atoms/cm$^3$ to 1×10$^{20}$ atoms/cm$^3$.

A second photoelectric conversion layer 26 of, for example, $In_{0.25}Ga_{0.75}N$ is formed below the second p$^-$-type GaN layer 28. Here, the second photoelectric conversion layer 26 has a band gap energy $B_2$ (eV).

A second n$^-$-type GaN layer 24 is formed below the second photoelectric conversion layer 26. A second n$^+$-type GaN layer 22 is formed below the second n$^-$-type GaN layer 24. The second n$^+$-type GaN layer 22 and the second n$^-$-type GaN layer 24 contain, for example, Si (silicon) as an n-type impurity.

The n-type impurity concentration of the second n$^+$-type GaN layer 22 is, for example, 2×10$^{19}$ atoms/cm$^3$ to 1×10$^{20}$ atoms/cm$^3$. The n-type impurity concentration of the second n$^-$-type GaN layer 24 is, for example, 1×10$^{18}$ atoms/cm$^3$ to 1×10$^{19}$ atoms/cm$^3$.

A reflection layer 32 of, for example, a metal is formed below the second n$^+$-type GaN layer 22. Incident illumination light is reflected by the reflection layer of a metal, so that the efficiency of the photoelectric conversion element is improved. Particularly, it is desirable to use Ag (silver) as the reflection layer 32 because it has a high reflectivity to visible light.

An n-side electrode 10 is formed below the reflection layer 32. The n-side electrode 10 is a terminal that outputs a current obtained by photoelectric conversion. The n-side electrode 10 is, for example, a metal electrode, and can employ, for example, a laminated structure of Ti (titanium)/Pt (platinum)/Au (gold) from the reflection layer 32 side.

A heat dissipation layer 36 of, for example, a metal is formed below the n-side electrode 10. It is desirable to use Cu (copper), which has a high heat conductivity, as the heat dissipation layer 36. Particularly when the photoelectric conversion element is used in such a form as so called a concentrating solar cell with an optical condenser, a material having a high heat conductivity is desirable because the heat quantity per unit area is large. It may be aluminum in terms of costs, or by using a diamond substrate, although costs are somewhat increased, reduction of efficiency and degradation by heat can be suppressed even if the optical concentration ratio is further increased.

The band gap energy $B_1$ of the first photoelectric conversion layer 16 is higher than the band gap energy $B_2$ of the second photoelectric conversion layer 26. That is, photoelectric conversion layers are arranged from the side at which illumination light is incident, in the descending order, with the highest the first, in terms of the band gap energy Bq (eV).

By making this arrangement, a portion of high energy in illumination light is photoelectrically converted by a photoelectric conversion layer having a high band gap energy. Therefore, energy loss during photoelectric conversion is eliminated, so that photoelectric conversion of high efficiency is achieved.

For the range of the band gap energy Bq (eV) of the photoelectric conversion layer, the relationship of $Ap-Fp<Bq \leq Ap$ is satisfied with a peak energy Ap (eV) and a full width at half maximum Fp (eV) of a light emission peak. In this embodiment, the relationship of $A_1-F_1<B_1 \leq A_1$ and $A_2-F_2<B_2 \leq A_2$ is satisfied.

By satisfying this relationship, high photoelectric conversion efficiency in the photoelectric conversion layer is achieved.

According to the photoelectric conversion element produced in this embodiment, a photoelectric conversion layer having a band gap energy optimized to a light emission peak of illumination light is provided, so that incident light energy can be efficiently converted. Particularly, power generation of high efficiency can be performed in an indoor environment where an illuminator using a LED is installed.

Figure 12:
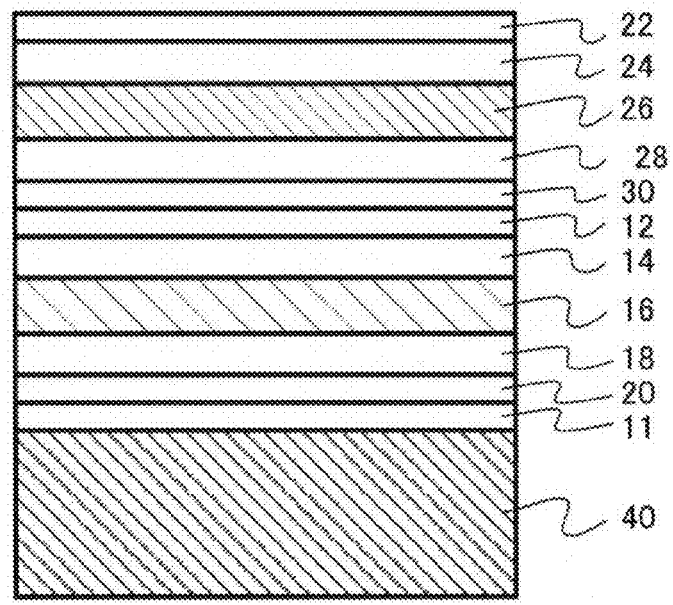
FIG. 12 is a sectional schematic view showing a method for manufacturing a photoelectric conversion element of the fifth embodiment.
Figure 13:
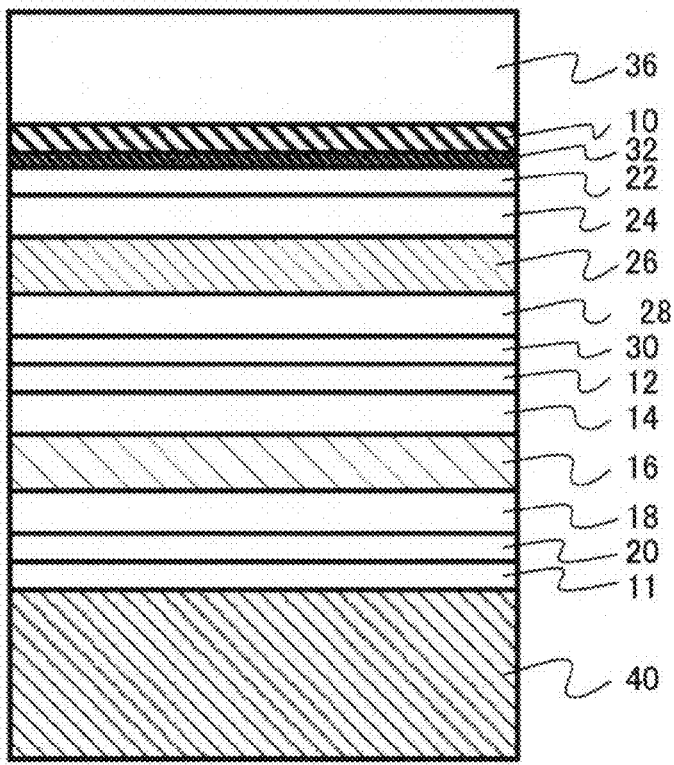
FIG. 13 is a sectional schematic view showing the method for manufacturing a photoelectric conversion element of the fifth embodiment.
Figure 14:
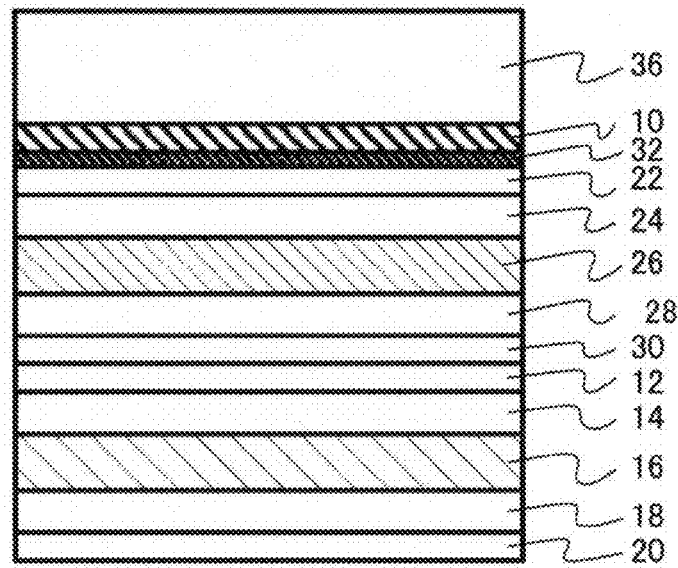
FIG. 14 is a sectional schematic view showing the method for manufacturing a photoelectric conversion element of the fifth embodiment.

A method for manufacturing a photoelectric conversion element of this embodiment will now be described. FIGS. 12, 13 and 14 are sectional schematic views showing the method for manufacturing a photoelectric conversion element of this embodiment.

First, for example, a single-crystal silicon substrate 40 having a thickness of about 500 μm is provided, and carried in a MOCVD device. Next, an AlN buffer layer 11, a first p$^+$-type GaN layer 20 and a first p$^-$-type GaN layer 18 are formed on the single-crystal silicon substrate 40 by a MOCVD (Metal Organic Chemical Vapor Deposition) method.

The AlN buffer layer 11, the first p$^+$-type GaN layer 20 and the first p$^-$-type GaN layer 18 are crystal-grown with TMG (trimethyl gallium) and NH$_3$ as a raw material gas, for example, under heated conditions at 1000° C. to 1100° C. Cp2Mg (cyclopentadienyl magnesium) is used for introduction of Mg as a p-type impurity.

After formation of the first p$^-$-type GaN layer 18, TMI (trimethyl indium) is added to the raw material gas to form a first photoelectric conversion layer 16 of, for example, In$_{0.15}$Ga$_{0.85}$N (indium gallium nitride).

After formation of the first photoelectric conversion layer 16, a first n$^-$-type GaN layer 14 and a first n$^+$-type GaN (gallium nitride) layer 12 are formed. The first n$^+$-type GaN (gallium nitride) layer 12 and the first n$^-$-type GaN layer 14 are crystal-grown with TMG (trimethyl gallium) and NH$_3$ as a raw material gas, for example, under heated conditions at 1000° C. to 1100° C. SiH$_4$ (silane) is used for introduction of Si as an n-type impurity.

After formation of the first n$^+$-type GaN (gallium nitride) layer 12, a second p$^+$-type GaN layer 30, a second p$^-$-type GaN layer 28, a second photoelectric conversion layer 26, a second n$^-$-type GaN layer 24 and a second n$^+$-type GaN layer 22 are formed (FIG. 12) by a process similar to the above-described process for forming the first n$^+$-type GaN (gallium nitride) layer 12 from the first p$^+$-type GaN layer 20.

The second photoelectric conversion layer 26 is, for example, In$_{0.25}$Ga$_{0.75}$N. The second photoelectric conversion layer 26 contains In (indium) in a concentration higher than that of the first photoelectric conversion layer 16. That is, the first photoelectric conversion layer 16 is a photoelectric conversion layer having a band gap energy greater than that of the second photoelectric conversion layer 26.

After formation of the second n$^+$-type GaN layer 22, the single-crystal silicon substrate 40 is taken out from the MOCVD device. A reflection layer 32 and an n-side electrode 10 are formed on the second n$^+$-type GaN layer 22.

The reflection layer 32 is, for example, Ag (silver), and the n-side electrode 10 is, for example, a laminated film of Ti (titanium)/Pt (platinum)/Au (gold) from the reflection layer 32 side. The reflection layer 32 and the n-side electrode 10 are formed by, for example, an electron beam vapor deposition method in an electron beam vapor deposition device.

Next, a Cu (copper) substrate 36 having a size similar to that of the single-crystal silicon substrate 40 is provided. For example a SnAgCu solder (not shown) is deposited on the Cu substrate 36.

Thereafter, the Cu substrate 36 and the n-side electrode 10 are superimposed on each other with the SnAgCu solder held therebetween, and laminated together by heating to, for example, 270° C. while a pressure is applied in a vacuum (FIG. 13).

Next, the single-crystal silicon substrate 40 is thinned to a thickness of about 50 μm by, for example, polishing it by a polishing machine. Thereafter, the single-crystal silicon substrate 40 is removed in its entirety by a dry etching device using a CF$_4$ (methane tetrafluoride) gas as a dry etching gas. Thereafter, the dry etching gas is changed to Cl$_2$ (chlorine), and the AlN buffer layer 11 is etched to expose the first p$^+$-type GaN layer 20 (FIG. 14).

Thereafter, a third p$^+$-type GaN layer (not shown: second p-type semiconductor layer) is formed on the first p$^+$-type GaN layer 20 by, for example, a MOCVD method. Thereafter, a p-side electrode 34 is formed on the surface of the third p$^+$-type GaN layer. The p-side electrode 34 is, for example, a metal electrode, and can employ, for example, a laminated structure of Ni (nickel)/Au (gold) from the semiconductor layer side.

By the above step, the photoelectric conversion element shown in FIG. 11 can be produced.

According to this embodiment, the first photoelectric conversion layer 16 as an InGaN layer having a low In composition is first formed, and the second photoelectric conversion layer 26 as an InGaN layer having a high In composition is then formed. Therefore, degradation of the photoelectric conversion layer can be suppressed to achieve high photoelectric conversion efficiency.

It has been found that when a p-side electrode is formed on a p-type GaN layer, the crystallinity of the surface of the p-side GaN layer is important as described above. According to this embodiment, the single-crystal silicon substrate 40 is peeled off from the first p$^+$-type GaN layer 20, and thereafter further a third p$^+$-type GaN layer (second p-type semiconductor layer) is formed by a MOCVD method.

In this way, a p-side electrode 34 is formed on the surface of the third p$^+$-type GaN layer without carrying out processing using accelerated particles, such as dry etching, or polishing processing. Therefore, the p-side electrode 34 can be formed while the disorder of crystallinity of the surface of the p-type GaN layer is reduced. Therefore, a p-side electrode having a low contact resistance can be achieved. Accordingly, a photoelectric conversion element with a low resistance loss and high efficiency can be produced.

Sixth Embodiment

A method for manufacturing a photoelectric conversion element of this embodiment includes forming a GaN-based p-type semiconductor layer on a substrate; forming on the p-type semiconductor layer a first photoelectric conversion layer having a composition denoted as $In_{x1}Ga_{y1}Al_{Z1}N$ ($0<x1\leq1$, $0\leq y1<1$, $0\leq z1<1$ and $x1+y1+z1\leq1$); forming on the first photoelectric conversion layer a second photoelectric conversion layer having a composition denoted as $In_{x2}Ga_{y2}Al_{Z2}N$ ($0<x2\leq1$, $0\leq y2<1$, $0\leq z2<1$ and $x2+y2+z2\leq1$) wherein $x1<x2$; forming a GaN-based n-type semiconductor layer on the second photoelectric conversion layer; forming an n-side electrode on the n-type semiconductor layer; removing the substrate to expose the p-type semiconductor layer; and forming a p-side electrode of ITO (indium tin oxide) or ZnO (zinc oxide) on the p-type semiconductor layer on a side opposite to the first photoelectric conversion layer.

The method for manufacturing a photoelectric conversion element of this embodiment is same as that in the fifth embodiment except that the p-side electrode of ITO or ZnO is formed without forming the second p-type semiconductor layer. Therefore, descriptions of matters that are in common with the fifth embodiment are omitted.

Figure 15:
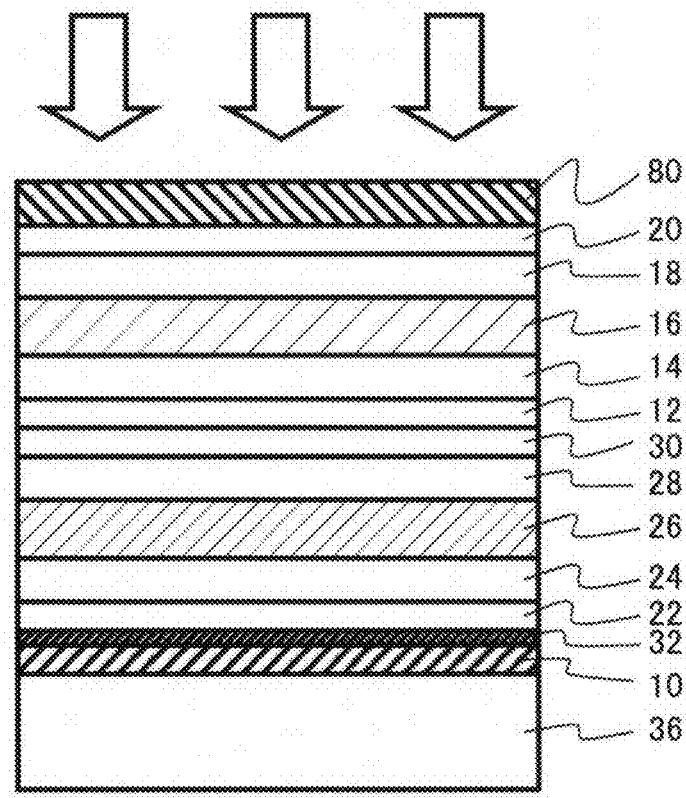
FIG. 15 is a sectional schematic view of a photoelectric conversion element produced in a sixth embodiment.

FIG. 15 is a sectional schematic view of the photoelectric conversion element produced in this embodiment. It is different from the photoelectric conversion element of the fifth embodiment shown in FIG. 11 in that a p-side electrode 80 formed on a first p$^+$-type GaN layer 20 is a transparent semiconductor electrode of ITO or ZnO.

The method for manufacturing a photoelectric conversion element is same as that in the fifth embodiment up to the step of exposing the first p$^+$-type GaN layer 20 (FIG. 14).

Subsequently, a p-side electrode of ITO (indium tin oxide) or ZnO (zinc oxide) is formed by, for example, a sputtering method.

For example, in the case of ITO, the electrode is formed by RF sputtering with ITO as a target. For example, ITO is deposited in an oxygen atmosphere at a RF power of 200 W at a substrate temperature of 25° C.

For example, by carrying out annealing in an oxygen atmosphere at 400° C. for 3 minutes after deposition of ITO, both the transparency and electrical conductivity of ITO can be secured.

According to this embodiment, the first photoelectric conversion layer 16 as an InGaN layer having a low In composition is first formed, and the second photoelectric conversion layer 26 as an InGaN layer having a high In composition is then formed. Therefore, degradation of the photoelectric conversion layer can be suppressed to achieve high photoelectric conversion efficiency.

ITO and ZnO are n-type semiconductors. The interface between ITO or ZnO and the first p$^+$-type GaN layer 20 (p-type semiconductor layer) forms a tunnel junction, so that the contact resistance can be reduced.

Therefore, a p-side electrode having a low contact resistance can be achieved, and a photoelectric conversion element with a low resistance loss and high efficiency can be produced.

Seventh Embodiment

A photoelectric conversion element includes an n-side electrode formed on a side at which illumination light is incident; a GaN-based n-type semiconductor layer formed below the electrode; a first photoelectric conversion layer formed below the semiconductor layer and having a composition denoted as $In_{x1}Ga_{y1}Al_{Z1}N$ ($0<x1\leq1$, $0\leq y1<1$, $0\leq z1<1$ and $x1+y1+z1\leq1$); a second photoelectric conversion layer formed below the photoelectric conversion layer and having a composition denoted as $In_{x2}Ga_{y2}Al_{Z2}N$ ($0<x2\leq1$, $0\leq y2<1$, $0\leq z2<1$ and $x2+y2+z2\leq1$) wherein $x1<x2$; a third photoelectric conversion layer formed below the second photoelectric conversion layer and having a composition denoted as $In_{x3}Ga_{y3}Al_{Z3}N$ ($0<x3\leq1$, $0\leq y3<1$, $0\leq z3<1$ and $x3+y3+z3\leq1$) wherein $x2<x3$; a GaN-based p-type semiconductor layer formed below the third photoelectric conversion layer; and a p-side electrode formed below the p-type semiconductor layer.

The photoelectric conversion element of this embodiment has the above-described structure, so that high photoelectric conversion efficiency can be achieved by an easy production method in, for example, a photoelectric conversion element that generates electric power with sunlight as incident light.

A method for manufacturing a photoelectric conversion element of this embodiment includes forming a GaN-based n-type semiconductor layer on a substrate; forming on the n-type semiconductor layer a first photoelectric conversion layer having a composition denoted as $In_{x1}Ga_{y1}Al_{Z1}N$ ($0<x1\leq1$, $0\leq y1<1$, $0\leq z1<1$ and $x1+y1+z1\leq1$); forming on the first photoelectric conversion layer a second photoelectric conversion layer having a composition denoted as $In_{x2}Ga_{y2}Al_{Z2}N$ ($0<x2\leq1$, $0\leq y2<1$, $0\leq z2<1$ and $x2+y2+z2\leq1$) wherein $x1<x2$; forming on the second photoelectric conversion layer a third photoelectric conversion layer having a composition denoted as $In_{x3}Ga_{y3}Al_{Z3}N$ ($0<x3\leq1$, $0\leq y3<1$, $0\leq z3<1$ and $x3+y3+z3\leq1$) wherein $x2<x3$; forming a GaN-based p-type semiconductor layer on the third photoelectric conversion layer; forming a p-side electrode on the p-type semiconductor layer; removing the substrate to expose the n-type semiconductor layer; and forming an n-side electrode on the n-type semiconductor layer on a side opposite to the first photoelectric conversion layer.

The method for manufacturing a photoelectric conversion element of this embodiment can enhance the photoelectric conversion efficiency of, for example, a photoelectric conversion element that generates electric power with sunlight as incident light.

Figure 16:
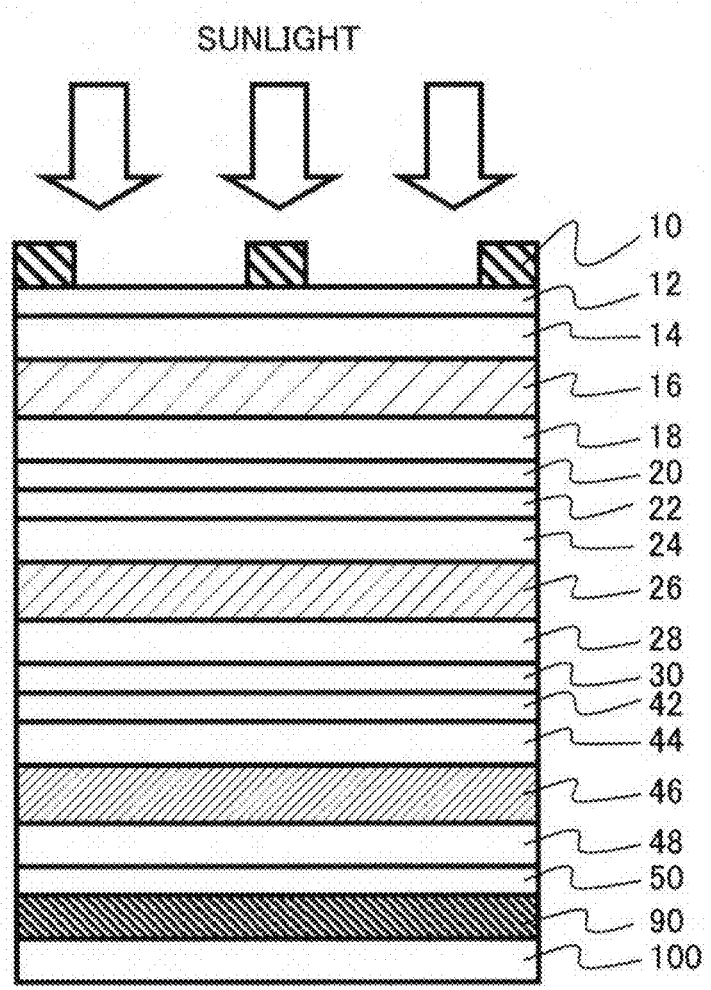
FIG. 16 is a sectional schematic view of a photoelectric conversion element of a seventh embodiment.

FIG. 16 is a sectional schematic view of the photoelectric conversion element of this embodiment. In the photoelectric conversion element of this embodiment, an n-side electrode 10 is formed on a side at which sunlight shown by white arrows in the figure is incident (upper side in FIG. 16). The n-side electrode 10 is, for example, a metal electrode, and can employ a laminated structure of, for example, Ti (titanium)/Pt (platinum)/Au (gold) from the lower layer.

A first n$^+$-type GaN (gallium nitride) layer 12 is formed below the n-side electrode 10. A first n$^-$-type GaN layer 14 is formed below the first n$^+$-type GaN layer 12. The first n$^+$-type GaN layer 12 and the first n$^-$-type GaN layer 14 contain, for example, Si (silicon) as an n-type impurity.

A first photoelectric conversion layer 16 of, for example, $In_{0.25}Ga_{0.75}N$ (indium gallium nitride) is formed below the first n$^-$-type GaN layer 14. Here, the first photoelectric conversion layer 16 has a band gap energy $B_1$ (eV).

A first p$^-$-type GaN layer 18 is formed below the first photoelectric conversion layer 16. A first p$^+$-type GaN layer 20 is formed below the first p$^-$-type GaN layer 18. The first p$^-$-type GaN layer 18 and the first p$^+$-type GaN layer 20 contain, for example, Mg (magnesium) as a p-type impurity.

A second n⁺-type GaN layer 22 is formed below the first p⁺-type GaN layer 20. A second n⁻-type GaN layer 24 is formed below the second n⁺-type GaN layer 22. The second n⁺-type GaN layer 22 and the second n⁻-type GaN layer 24 contain, for example, Si (silicon) as an n-type impurity.

A second photoelectric conversion layer 26 of, for example, $In_{0.40}Ga_{0.60}N$ is formed below the second n⁻-type GaN layer 24. Here, the second photoelectric conversion layer 26 has a band gap energy $B_2$ (eV).

A second p⁻-type GaN layer 28 is formed below the second photoelectric conversion layer 26. A second p⁺-type GaN layer 30 is formed below the second p⁻-type GaN layer 28. The second p⁻-type GaN layer 28 and the second p⁺-type GaN layer 30 contain, for example, Mg (magnesium) as a p-type impurity.

A third n⁺-type GaN layer 42 is formed below the second p⁺-type GaN layer 30. A third n⁻-type GaN layer 44 is formed below the third n⁺-type GaN layer 42. The third n⁺-type GaN layer 42 and the third n⁻-type GaN layer 44 contain, for example, Si (silicon) as an n-type impurity.

A third photoelectric conversion layer 46 of, for example, $In_{0.45}Ga_{0.55}N$ is formed below the third n⁻-type GaN layer 44. Here, the third photoelectric conversion layer 46 has a band gap energy $B_3$ (eV).

A third p⁻-type GaN layer 48 is formed below the third photoelectric conversion layer 46. A third p⁺-type GaN layer 50 is formed below the third p⁻-type GaN layer 48. The third p⁻-type GaN layer 48 and the third p⁺-type GaN layer 50 contain, for example, Mg (magnesium) as a p-type impurity.

A p-side electrode 90 of, for example, ITO (indium tin oxide) is formed below the third p⁺-type GaN layer 50. The p-side electrode 90 is a terminal that outputs a current obtained by photoelectric conversion.

A Si (silicon) substrate 100 is provided below the p-side electrode 90. The Si (silicon) substrate 100 functions as a photoelectric conversion layer. The structure of the Si substrate that functions as a photoelectric conversion layer is same as the structure of a normal single-crystal silicon substrate solar cell, and includes an nSi layer, an n⁺Si layer, a pSi layer, a p⁺Si layer and a p-side electrode. For the electrode, the ITO part may be drawn out from the side face and operated independently and in this case, it is necessary to provide different circuits for the Si substrate and GaN at a location to which the electrode is drawn out even from the ITO electrode, so that the structure is complicated. The electrode may be drawn out from the p-side electrode of the Si substrate 100, rather than from ITO. In this case, operations are stabilized by designing the power generation amperage of each layer so that the currents become equal.

In this embodiment, carrier collection efficiency is improved by providing on the p-type semiconductor layer side a layer corresponding to so called a back surface electric field layer and providing on the n-type semiconductor layer side a layer corresponding to so called a window layer, with first, second and third photoelectric conversion layers held therebetween, respectively.

The band gap energy $B_1$ of the first photoelectric conversion layer 16 is higher than the band gap energy $B_2$ of the second photoelectric conversion layer 26, and the band gap energy $B_2$ of the second photoelectric conversion layer 26 is higher than the band gap energy $B_3$ of the third photoelectric conversion layer 46. That is, photoelectric conversion layers are arranged from the side at which illumination light is incident, in the descending order, with the highest the first, in terms of the band gap energy Bq (eV).

By making this arrangement, a portion of high energy in illumination light is photoelectrically converted by a photoelectric conversion layer having a high band gap energy. Therefore, energy loss during photoelectric conversion is eliminated, so that photoelectric conversion of high efficiency is achieved.

A method for manufacturing a photoelectric conversion element of this embodiment will now be described.

First, for example, a single-crystal silicon substrate having a thickness of about 500 μm is provided, and carried in a MOCVD device. Next, an AlN buffer layer (not shown), a first n⁺-type GaN (gallium nitride) layer 12 and a first n⁻-type GaN layer 14 are formed on the single-crystal silicon substrate 40 by a MOCVD (Metal Organic Chemical Vapor Deposition) method.

The AlN buffer layer, the first n⁺-type GaN (gallium nitride) layer 12 and the first n⁻-type GaN layer 14 are crystal-grown with TMG (trimethyl gallium) and $NH_3$ as a raw material gas, for example, under heated conditions at 1000° C. to 1100° C. $SiH_4$ (silane) is used for introduction of Si as an n-type impurity.

After formation of the n⁻-type GaN layer 14, TMI (trimethyl indium) is added to the raw material gas to form a first photoelectric conversion layer 16 of, for example, $In_{0.25}Ga_{0.75}N$ (indium gallium nitride).

After formation of the first photoelectric conversion layer 16, a first p⁻-type GaN layer 18 and a first p⁺-type GaN layer 20 are formed. The first p⁻-type GaN layer 18 and the first p⁺-type GaN layer 20 are crystal-grown with TMG (trimethyl gallium) and $NH_3$ as a raw material gas under heated conditions at 1000° C. Cp2Mg (cyclopentadienyl magnesium) is used for introduction of Mg as a p-type impurity.

After formation of the first p⁺-type GaN layer 20, a second n⁺-type GaN layer 22, a second n⁻-type GaN layer 24, a second photoelectric conversion layer 26, a second p⁻-type GaN layer 28 and a second p⁺-type GaN layer 30 are formed by a process similar to the above-described process for forming the first p⁺-type GaN layer 20 from the first n⁺-type GaN (gallium nitride) layer 12.

The second photoelectric conversion layer 26 is, for example, $In_{0.40}Ga_{0.60}N$. The second photoelectric conversion layer 26 contains In (indium) in a concentration higher than that of the first photoelectric conversion layer 16. That is, the first photoelectric conversion layer 16 is a photoelectric conversion layer having a band gap energy greater than that of the second photoelectric conversion layer 26.

After formation of the second p⁺-type GaN layer 30, a third n⁺-type GaN layer 42, a third n⁻-type GaN layer 44, a third photoelectric conversion layer 46, a third p⁻-type GaN layer 48 and a third p⁺-type GaN layer 50 are formed by a process similar to the above-described process for forming the first p⁺-type GaN layer 20 from the first n⁺-type GaN (gallium nitride) layer 12.

The third photoelectric conversion layer 46 is, for example, $In_{0.45}Ga_{0.55}N$. The third photoelectric conversion layer 46 contains In (indium) in a concentration higher than that of the second photoelectric conversion layer 26. That is, the second photoelectric conversion layer 26 is a photoelectric conversion layer having a band gap energy greater than that of the third photoelectric conversion layer 46.

After formation of the third p⁺-type GaN layer 50, the single-crystal silicon substrate is taken out from the MOCVD device. A p-side electrode 90 of ITO (indium tin oxide) is formed on the third p⁺-type GaN layer 50. Formation of the p-side electrode 90 is carried out by, for example, an electron beam vapor deposition method in an electron beam vapor deposition device.

Next, a silicon substrate having a size similar to that of the single-crystal silicon substrate is provided. For example an ITO film is deposited on the silicon substrate.

Thereafter, ITO of the p-side electrode of the single-crystal silicon substrate and the ITO film of the silicon substrate are superimposed on each other so as to contact each other and laminated together by heating to, for example, 270° C. while a pressure is applied in a vacuum.

Next, the single-crystal silicon substrate used for growth of the GaN-based semiconductor is thinned to a thickness of about 50 μm by, for example, polishing it by a polishing machine. Thereafter, the single-crystal silicon substrate 40 is removed in its entirety by a dry etching device using a $CF_4$ (methane tetrafluoride) gas as a dry etching gas. Thereafter, the dry etching gas is changed to $Cl_2$ (chlorine), and the AlN buffer layer is etched to expose the first $n^+$-type GaN (gallium nitride) layer 12.

Thereafter, the surface of the first $n^+$-type GaN (gallium nitride) layer 12 is etched with KOH (potassium hydroxide) to form an unevenness on the surface. After a rinsing treatment, an n-side electrode 10 is formed on the surface of the first $n^+$-type GaN (gallium nitride) layer 12. The n-side electrode 10 is, for example, a laminated film of Ti (titanium)/Pt (platinum)/Au (gold) from, for example, the first $n^+$-type GaN (gallium nitride) layer 12 side.

By the above step, the photoelectric conversion element shown in FIG. 16 can be formed.

As described above, as a result of studies by the present disclosure, it has been found that degradation of characteristics is significant particularly in the case of a high concentration of In (indium) (high composition).

It has become evident that degradation depends on the heating temperature and heating time, and an InGaN layer having a higher In composition is degraded at a lower temperature and in a shorter time. When the crystallinity of the InGaN layer is degraded, the photoelectric conversion efficiency of the photoelectric conversion element is deteriorated.

According to this embodiment, the first photoelectric conversion layer 16 as an InGaN layer having a low In composition is first formed, and the second photoelectric conversion layer 26 as an InGaN layer having a high In composition is then formed. Further, the third photoelectric conversion layer 46, an InGaN layer having a higher In composition, is formed. Therefore, degradation of the photoelectric conversion layer by the heat treatment during film formation can be suppressed to achieve high photoelectric conversion efficiency.

It has been found that when a p-side electrode is formed on a p-type GaN layer, the crystallinity of the surface of the p-side GaN layer is important. That is, if the crystallinity of the surface of the p-side GaN layer is disordered, the contact resistance of the p-side electrode increases. Therefore, particularly when processing with accelerated particles, such as dry etching, or polishing processing is carried out for surface processing of the p-side GaN layer, the contact resistance is significantly increased.

According to this embodiment, the p-side electrode can be formed without carrying out dry etching or polishing processing for removing the substrate on the p-type GaN layer, or the like. Therefore, a p-side electrode having a low contact resistance can be achieved. Accordingly, a photoelectric conversion element with a low resistance loss and high efficiency can be achieved.

By conforming the order of lamination of the layers of the photoelectric conversion element to the configuration of this embodiment shown in FIG. 16, it becomes easy to form the p-side electrode without carrying out dry etching or polishing processing for removing the substrate on the p-type GaN layer, or the like.

In this embodiment, explanations have been provided taking as an example a case where the photoelectric conversion layer of the InGaN layer has three layers, but a photoelectric conversion layer of an InGaN layer having two or four layers can also be provided in consideration of production costs and photoelectric conversion efficiency.

The Si substrate that functions as a photoelectric conversion layer may not necessarily be provided. When the Si substrate is not provided, the composition of the photoelectric conversion layer can also be set to, for example, $In_{0.40}Ga_{0.60}N$, $In_{0.55}Ga_{0.45}N$ and InN in the ascending order, with the lowest the first, in terms of the In composition, for enhancing efficiency of absorption of light having a long wavelength.

In place of a single-crystal silicon substrate, any other substrate capable of forming a semiconductor layer on the substrate can also be used.

In the explanation of the embodiments, descriptions have been omitted for parts and the like that are not directly required for explanation of the present disclosure, in the photoelectric conversion element, the photoelectric conversion system, the method for manufacturing a photoelectric conversion element, and so on, but required components that are related to the photoelectric conversion element, the photoelectric conversion system and the method for manufacturing a photoelectric conversion element can also be appropriately selected and used.

For example, layers that facilitate characteristics and the production method can also be appropriately inserted between the substrate and the semiconductor layer, the electrode or the like.

While certain embodiments have been described, these embodiments have been presented by way of example only, and are not intended to limit the scope of the inventions. Indeed, the photoelectric conversion element, the photoelectric conversion system and the method for manufacturing a photoelectric conversion element described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A photoelectric conversion element performing photoelectric conversion by receiving light having n (n is a natural number) light emission peaks, each of the light emission peaks having a peak energy Ap (eV) (where $1 \leq p \leq n$ and $2 \leq n$) of $1.59 \leq Ap \leq 3.26$ and a full width at half maximum Fp (eV) (where $1 \leq p \leq n$ and $2 \leq n$), the photoelectric conversion element comprising:

m (m is a natural number) photoelectric conversion layers having a band gap energy Bq (eV) (where $1 \leq q \leq m$ and $2 \leq m \leq n$), the m photoelectric conversion layers each satisfy the relationship of $Ap-Fp<Bq \leq Ap$ with respect to any one of the n light emission peaks.

2. The element according to claim 1, wherein the m photoelectric conversion layers are arranged from the side at which the light is incident, in the descending order, with the highest the first, in terms of the band gap energy Bq (eV).

3. The element according to claim 1, wherein m=n.

4. The element according to claim 1, wherein the m photoelectric conversion layers each satisfy the relationship of Ap−0.9Fp<Bq<Ap−0.7Fp with respect to any one of the n light emission peaks.

5. The element according to claim 1, wherein the m photoelectric conversion layers have a composition denoted as $In_xGa_yAl_zN$ ($0<x\leq1$, $0\leq y<1$, $0\leq z<1$ and $x+y+z\leq1$).

6. A photoelectric conversion element comprising:
an n-side electrode formed on a side at which light is incident;
a GaN-based n-type semiconductor layer formed below the n-side electrode;
a first photoelectric conversion layer formed below the n-type semiconductor layer and having a composition denoted as $In_{x1}Ga_{y1}Al_{Z1}N$ ($0<x1\leq1$, $0\leq y1<1$, $0\leq z1<1$ and $x1+y1+z1\leq1$);
a second photoelectric conversion layer formed below the first photoelectric conversion layer and having a composition denoted as $In_{x2}Ga_{y2}Al_{Z2}N$ ($0<x2\leq1$, $0\leq y2<1$, $0\leq z2<1$ and $x2+y2+z2\leq1$) wherein $x1<x2$;
a GaN-based p-type semiconductor layer formed below the second photoelectric conversion layer; and
a p-side electrode formed below the p-type semiconductor layer.

7. The element according to claim 6, further comprising a heat dissipation layer of copper (Cu) below the p-side electrode.

8. The element according to claim 6, further comprising a reflection layer of silver (Ag) between the p-side electrode and the p-type semiconductor layer.

* * * * *